United States Patent
Bagheri et al.

(10) Patent No.: US 7,633,341 B2
(45) Date of Patent: Dec. 15, 2009

(54) WIDEBAND CIRCUITS AND METHODS

(75) Inventors: Mahdi Bagheri, Los Angeles, CA (US); Rahim Bagheri, Los Angeles, CA (US); Ahmad Mirzaei, Los Angeles, CA (US); Abbas Komijani, Los Angeles, CA (US); Edris Rostami, Los Angeles, CA (US); Masoud Djafari, Marina Del Rey, CA (US)

(73) Assignee: Wilinx Corporation, Carlsbad, CA (US)

( * ) Notice: Subject to any disclaimer, the term of this patent is extended or adjusted under 35 U.S.C. 154(b) by 469 days.

(21) Appl. No.: 11/584,453

(22) Filed: Oct. 20, 2006

(65) Prior Publication Data

US 2007/0090877 A1 Apr. 26, 2007

Related U.S. Application Data

(63) Continuation-in-part of application No. 11/256,118, filed on Oct. 21, 2005, now Pat. No. 7,372,335.

(51) Int. Cl.
*H03F 3/45* (2006.01)
(52) U.S. Cl. ........................ 330/253; 330/302
(58) Field of Classification Search ............ 330/253, 330/254, 302
See application file for complete search history.

(56) References Cited

U.S. PATENT DOCUMENTS

| | | | |
|---|---|---|---|
| 6,417,737 B1 | 7/2002 | Moloudi et al. | |
| 6,489,862 B1 | 12/2002 | Frank | |
| 6,667,666 B2 | 12/2003 | Uzunoglu | |
| 6,778,017 B2 | 8/2004 | Analui et al. | |
| 6,781,467 B2 | 8/2004 | Sun | |
| 7,170,349 B2 * | 1/2007 | Bhattacharjee et al. | 330/254 |

OTHER PUBLICATIONS

Thomas H. Lee, "The Design of CMOS Radio-Frequency Integrated Circuits", Published 1998, pp. 270-313, Cambridge University Press.

* cited by examiner

*Primary Examiner*—Khanh V Nguyen
(74) *Attorney, Agent, or Firm*—Chad R. Walsh; Fountainhead Law Group P.C.

(57) ABSTRACT

Embodiments of the present invention include circuits and methods with wide bandwidths. In one embodiment, parasitic capacitances of the output of a first stage and the input of a second stage are included in a network. The output of the first stage is coupled to the input of the network, and the input of the second stage is coupled to an intermediate node of the network. In one embodiment, the parasitic capacitance of the second stage is the largest capacitance in the network. In another embodiment, passive networks are coupled to the outputs of a stage, and one or more current injection circuits may be used to extend the bandwidth of the circuit.

52 Claims, 17 Drawing Sheets

100A

100B

100C

100D

WIDEBAND CIRCUITS AND METHODS

CROSS REFERENCE TO RELATED APPLICATIONS

This application is a continuation-in-part of and claims the benefit of U.S. patent application Ser. No. 11/256,118, filed Oct. 21, 2005 the disclosure of which is hereby incorporated herein by reference.

BACKGROUND

The present invention relates to wideband circuits, and in particular, to wideband circuits that may be used between circuit stages.

Electronic circuits are typically built in stages. For example, an analog circuit may include one or more amplifiers connected in series, wherein each amplifier constitutes a stage of the circuit with a particular amplification strength (i.e., gain). Other stages may include filters, mixers, analog-to-digital converters ("ADC"), digital-to-analog converters ("DAC"), a variety of different amplifiers such as power amplifiers or low noise amplifiers, or other circuit stages. Digital circuits may also be connected in stages as is well known by those skilled in the art.

FIG. 1A illustrates one problem associates with circuit stages. A first circuit stage 101 receives an input signal "In" and provides an output signal to the input of a second circuit stage 102, which in turn generates an output signal "Out." In many stages, the output of the stage includes some kind of output impedance for translating currents at the output into voltages. The output impedance in this example is represented by a resistor ("$R_L$") 103 connected between the output and a power supply Vdd. The output node of any circuit stage will have a corresponding parasitic output capacitance. Parasitic output capacitance may be due to a variety of well-known factors such as the capacitance introduced by conductive traces (i.e., routing capacitance), the gate-to-drain capacitance or drain-to-substrate capacitance of MOS transistors, or the capacitance of contacts between a conductive trace and a resistor terminal to name just a few. All the parasitic capacitances of the output node of stage 101 are represented by capacitor $C_{p1}$. Similarly, the input nodes of circuit stages will also have associated parasitic capacitances stemming from, for example, the gate capacitance of MOS transistors and a variety of other well-known sources. All the parasitic capacitances of the input node of stage 102 are represented by capacitor $C_{p2}$.

FIG. 1B shows an equivalent circuit of FIG. 1A and the corresponding frequency response. One problem associated with parasitic capacitance is that it can effectively narrow the bandwidth of signal frequencies that can be coupled between stages of an electronic circuit. For example, signals at the output of stage 101 will see a low pass filter caused by the parallel combination of the output impedance and the parasitic capacitances. In FIG. 1B, the combined parasitic capacitances are represented by $C_T$. The plot in FIG. 1B shows the bandwidth of the circuit where the value of $C_T$ and $R_L$ are as follows:

$C_T$=600 fF $R_L$=50Ω.

The output signal of stage 101 will be attenuated by 3 dB at the following frequency:

$f_{3db}=1/2\pi R(C_{p1}+C_{p2})$.

For comparison with plots below, FIG. 1B shows the 1 dB frequency rather than the 3 dB frequency. However, in this example the 1 dB frequency is about one-half of the 3 dB frequency. Therefore, to increasing the bandwidth of the circuit, either the resistance or capacitance must be reduced. Since resistance is typically used to set the gain of the previous stage, it is generally desirable to reduce the parasitic capacitance. However, in any given process technology or application, there are practical limits to how far parasitic capacitances can be reduced. Thus, it is generally desirable to reduce the "effects" of parasitic capacitance on the signals that are being processed by each stage of the circuit.

FIG. 1C is a prior art interstage circuit 100C. In this circuit, a first stage includes transistor (M1) 101 having a gate coupled to receive an input signal and a drain having a parasitic capacitance $C_{pM1}$. The output node of transistor 101 has a further parasitic capacitance $C_{pR}$ from the parasitic capacitance due to routing. Since the capacitances are in parallel, these parasitic capacitances will add and can be represented by a single capacitor as shown. Similarly, a second stage includes transistor (M2) 102 having a gate coupled to receive the output signal of the previous stage. The input to the second stage has a parasitic capacitance of $C_{pM2}$. A passive network 104 is provided between the output of transistor 101 and the input of transistor 102. In this circuit, the input of the passive network is coupled to the drain output of transistor 101 and the output of the passive network 104 is coupled to the gate of transistor 102. Network 104 includes an inductor (L2) 105, input capacitances $C_{pM1}$ and $C_{pR}$, output capacitance $C_{pM2}$, and resistor 103. Network 104 is a third-order filter between the output of the first stage and the input of the second stage. In this circuit, parasitic capacitances are absorbed into network 104 and the overall bandwidth of the system may be increased. In such a case, the output of the network includes the load for setting the gain of the previous stage. However, the bandwidth is typically limited by the parasitic capacitance at the input of the second stage (here, the gate capacitance of M2). Thus, for a given gain requirement, the bandwidth will typically be constrained by the capacitive loading at the output of the filter caused by the parasitic input capacitance of M2.

FIG. 1D illustrates a similar approach using a higher order network. Network 120 is a 5th-order filter having an input connected to the output of the first stage (i.e., the drain of M1) and an output connected to the input of the second stage (i.e., the gate of M2). Network 120 includes inductors (L2) 121 and (L3) 123, input capacitances $C_{pM1}$ and $C_{pR}$, intermediate capacitance ($C_{f1}$) 122, output capacitance $C_{pM2}$, and resistor 103. As before, the resistor at the network output may be used to set the load impedance (i.e., gain), and the parasitic capacitances are absorbed into the input and output of network 120. Thus, the bandwidth of the system is increased.

While the prior art circuits in FIGS. 1C and 1D are useful in increasing the bandwidth, such circuits are still limited by the size of the parasitic capacitances. For example, the input of a stage implemented using MOS devices will typically have a large parasitic gate capacitance. In many applications it may be desirable to optimize the gain and bandwidth of the circuit. Accordingly, for a given gain requirement, smaller parasitic capacitance values would be required. Similarly, it is often desirable to increase the size of the M2 device so that the subsequent stage can deliver more current, for example. Thus, it is generally desirable to maximize the parasitic capacitance that can be tolerated at the input of the second stage while maintaining maximum bandwidth and gain. Thus, there is a need for improved wideband circuits and methods.

SUMMARY

Embodiments of the present invention include circuits and methods that reduce the deleterious effects of capacitance on bandwidth and gain. In one embodiment the present invention includes a circuit comprising a first stage having an output terminal, the output terminal having a corresponding first parasitic capacitance, a second stage having an input terminal, the input terminal having a corresponding second parasitic capacitance, and a passive network having an input terminal coupled to the output terminal of the first stage and an intermediate node coupled to the input terminal of the second stage, wherein the first parasitic capacitance is included as the input capacitance of the passive network, and the second parasitic capacitance is included as the capacitance of the intermediate node of the passive network, and wherein the second parasitic capacitance is the largest capacitance in the passive network.

In one embodiment, the passive network is a fourth order or greater network.

In one embodiment, the second parasitic capacitance corresponds to at least the gate of a MOS transistor.

In one embodiment, the passive network includes a first inductor coupled between the output of the first stage and the intermediate node and a second inductor coupled between the intermediate node and a first terminal of a resistor.

In one embodiment, the passive network further comprises a capacitor coupled between the first terminal of the resistor and a reference voltage.

In one embodiment, the passive network includes a first two-port network coupled between the first stage and second stage, and a second single-port network including a resistor coupled to the intermediate node.

In one embodiment, the passive network has a frequency response at the intermediate node having less than three decibels (3 dB) of ripple from a first low frequency to the corner frequency of the passive network.

In one embodiment, the first low frequency is less than three (3) gigahertz and the corner frequency is at least ten (10) gigahertz.

In one embodiment, the first stage is a low noise amplifier or a mixer.

In another embodiment, the present invention includes a circuit comprising a first stage having an output terminal, the output terminal having a corresponding first parasitic capacitance, a second stage having an input terminal, the input terminal having a corresponding second parasitic capacitance, and one or more first inductors coupled in series between the first stage output terminal and a first intermediate node, and one or more second inductors coupled in series between the first intermediate node and a first terminal of a load resistor, wherein second stage input terminal and corresponding second parasitic capacitance is coupled to the first intermediate node.

In one embodiment, the one or more first inductors are two or more inductors coupled between the first stage output terminal and the first intermediate node, and wherein a capacitor is coupled between one or more second intermediate nodes of the two or more inductors.

In one embodiment, the present invention further comprises one or more capacitors, wherein the one or more first inductors, the one or more second inductors, and the one or more capacitors are configured as a fourth order or greater ladder network.

In one embodiment, the second parasitic capacitance is the largest capacitance coupled to the first or second inductors.

In one embodiment, the second stage has a second input terminal having a corresponding third parasitic capacitance, and wherein the second input terminal of the second stage and corresponding third parasitic capacitance is coupled to a second intermediate node.

In another embodiment, the present invention includes a method comprising generating a first signal in a first stage at an output terminal, the output terminal having a corresponding first parasitic capacitance, coupling the first signal to a second stage having an input terminal, the input terminal having a corresponding second parasitic capacitance, and processing the first signal in a network having an input terminal coupled to the output terminal of the first stage and an intermediate node coupled to the input terminal of the second stage, wherein the first parasitic capacitance is included as the input capacitance of the network, and the second parasitic capacitance is included as the capacitance of the intermediate node of the network and wherein the second parasitic capacitance is the largest capacitance in the network. In one embodiment, the network is a fourth order or greater network. In one embodiment, the first stage is a low noise amplifier or mixer. In one embodiment, the network comprises one or more first inductors, at least one capacitor, one or more second inductors, and a resistor, and wherein the one or more first inductors, the one or more second inductors, the at least one capacitor, the resistor, and the first and second parasitic capacitances are configured as a fourth order or greater ladder network having the resistor coupled to a last node of the network. In one embodiment, the inductance of the first and second inductors, the capacitance of the at least one capacitor, and the capacitance of the first and second capacitances provide a frequency response at the intermediate node that is substantially flat up to the corner frequency of the network.

In another embodiment, the present invention includes an electronic circuit comprising a differential stage having first and second output terminals, a first passive network having an input terminal coupled to the first output terminal of the differential stage, the first passive network comprising a first resistive load, a second passive network having an input terminal coupled to the second output terminal of the differential stage, the second passive network comprising a second resistive load, a first current injection circuit having a control input coupled to a first node in the first passive network and an output coupled to a second node in the second passive network, and a second current injection circuit having a control input coupled to a third node in the second passive network and an output coupled to a fourth node in the first passive network.

In one embodiment, the first and second passive networks are symmetric.

In one embodiment, the first and second passive networks are fourth order or greater networks.

In one embodiment, the first and second passive networks are LC ladder networks.

In one embodiment, the first and second passive networks are Chebyshev filters.

In one embodiment, the first and second passive networks are Butterworth filters.

In one embodiment, the first current injection circuit comprises at least one MOS transistor and the second current injection circuit comprises at least one MOS transistor.

In one embodiment, the control input of the first current injection circuit is coupled to the input of the first passive network, and the control input of the second current injection circuit is coupled to the input of the second passive network.

In one embodiment, the control input of the first current injection circuit is coupled to an intermediate node of the first passive network, and the control input of the second current injection circuit is coupled to an intermediate node of the second passive network.

In one embodiment, the control input of the first current injection circuit is coupled to a last node of the first passive network, and the control input of the second current injection circuit is coupled to a last node of the second passive network.

In one embodiment, the output of the first current injection circuit is coupled to the second resistive load of the second passive network, and the output of the second current injection circuit is coupled to the first resistive load of the first passive network.

In one embodiment, the output of the first current injection circuit is coupled to an intermediate node of the second passive network, and the output of the second current injection circuit is coupled to an intermediate node of the first passive network.

In one embodiment, the output of the first current injection circuit is coupled to the input of the second passive network, and the output of the second current injection circuit is coupled to the input of the first passive network.

In one embodiment, the output of the first current injection circuit is coupled to the last node of the second passive network, and the output of the second current injection circuit is coupled to the last node of the first passive network.

In one embodiment, the present invention further comprises third and fourth current injection circuits, wherein the third current injection circuit includes a control input coupled to a node in the first or second passive network and an output coupled to the same or different node as the control input in the first or second passive network, wherein the fourth current injection circuit includes a control input coupled to a node in the first or second passive network and an output coupled to the same or different node as the control input in the first or second passive network, and wherein neither the third current injection circuit nor the fourth current injection circuit have both a control input coupled to the same node as the control input of the first or second current injection circuits and an output coupled to the same node as the output of the first or second current injection circuits.

In one embodiment, the present invention further comprises third and fourth current injection circuits, wherein the control input of the first current injection circuit is coupled to a different node in the first passive network than the control input of the third current injection circuit, wherein the control input of the second current injection circuit is coupled to a different node in the second passive network than the control input of the fourth current injection circuit.

In one embodiment, the present invention further comprising third and fourth current injection circuits, wherein the control input of the first current injection circuit is coupled to a same node in the first passive network as the control input of the third current injection circuit, and the output of the first current injection circuit is coupled to a different node than the output of the third current injection circuit, and wherein the control input of the second current injection circuit is coupled to the same node in the second passive network as the control input of the fourth current injection circuit, and the output of the second current injection circuit is coupled to a different node than the output of the fourth current injection circuit.

In one embodiment, the control input of the first current injection circuit is coupled to the input of the first passive network, the output of the first current injection circuit is coupled to the second resistive load of the second passive network, the control input of the second current injection circuit is coupled to the input of the second passive network, and the output of the second current injection circuit is coupled to the first resistive load of the first passive network, the circuit further comprising a third current injection circuit having a control input coupled to the first resistive load of the first passive network and an output coupled to the input of the second passive network, and a fourth current injection circuit having a control input coupled to the second resistive load of the second passive network and an output coupled to the input of the first passive network.

In one embodiment, the first current injection circuit comprises a first MOS transistor, the second current injection circuit comprises a second MOS transistor, the third current injection circuit comprises a third MOS transistor, and the fourth current injection circuit comprises a fourth MOS transistor.

In one embodiment, the first stage is a power amplifier, low noise amplifier, or mixer.

In one embodiment, the present invention further comprises a second differential stage having a first input terminal coupled to an intermediate node in the first passive network and a second input terminal coupled to an intermediate node in the second passive network.

In one embodiment, the first and second input terminals of the second differential stage have a corresponding first and second parasitic capacitances, and wherein the first parasitic capacitance is included as the capacitance of the intermediate node of the first passive network and the second parasitic capacitance is included as the capacitance of the intermediate node of the second passive network.

In one embodiment, the first parasitic capacitance is the largest capacitance in the first passive network, and the second parasitic capacitance is the largest capacitance in the second passive network.

In another embodiment, the present invention includes an electronic circuit comprising a first stage having a first output terminal, a passive network having an input terminal coupled to the first output terminal of the first stage, and a first current injection circuit having a control input coupled to a node in the first passive network and an output coupled to another node in the first passive network.

In one embodiment, the present invention further comprises a second current injection circuit having a control input coupled to a node in the first passive network and an output coupled to another node in the first passive network, wherein the first current injection circuit and the second current injection circuit are not coupled in parallel. In one embodiment, the first passive network is a fourth order or greater network, LC ladder network, Chebyshev filter, or Butterworth filter. In one embodiment, the current injection circuit comprises at least one MOS transistor. In one embodiment, the first stage is a power amplifier, low noise amplifier, or mixer. In one embodiment, the present invention further comprises a second stage having a first input terminal coupled to an intermediate node in the first passive network. In one embodiment, the first input terminal of the second stage has a corresponding first parasitic capacitance, and wherein the first parasitic capacitance is included as the capacitance of the intermediate node of the first passive network. In one embodiment, the first parasitic capacitance is the largest capacitance in the first passive network.

In another embodiment, the present invention includes an electronic circuit comprising a differential stage having first and second output terminals, a first LC ladder network having an input terminal coupled to the first output terminal of the differential stage, the first LC ladder network comprising a first resistor, a second LC ladder network having an input terminal coupled to the second output terminal of the differential stage, the second LC ladder network comprising a second resistor, a first MOS transistor having a control input coupled to the input of the first LC ladder network and an output coupled to the second resistor in the second passive network, and a second MOS transistor having a control input coupled to the input of the second LC ladder network and an output coupled to the first resistor in the first passive network.

In one embodiment, the present invention further comprises a third MOS transistor having a control input coupled to the first resistor in the first passive network and an output coupled to the input of the second passive network, and a fourth MOS transistor having a control input coupled to the second resistor in the second passive network and an output coupled to the input of the first passive network.

In one embodiment, the control input of the first MOS transistor is coupled to a bias voltage through a first resistor, and the control input of the second MOS transistor is coupled to a bias voltage through a second resistor.

In one embodiment, the control input of the first MOS transistor is coupled to the input of the first LC ladder network through a first capacitor, and the control input of the second MOS transistor is coupled to the input of the second LC ladder network through a second capacitor.

In one embodiment, a first and second LC ladder networks are Chebyshev filters.

In one embodiment, first and second LC ladder networks are Butterworth filters.

In one embodiment, first and second LC ladder networks are fourth order or greater networks.

In one embodiment, the present invention further comprises a second differential stage having a first input terminal coupled to an intermediate node in the first LC ladder network and a second input terminal coupled to an intermediate node in the second LC ladder network.

In one embodiment, the first and second input terminals of the second differential stage have a corresponding first and second parasitic capacitances, and wherein the first parasitic capacitance is included as the capacitance of the intermediate node of the first LC ladder network and the second parasitic capacitance is included as the capacitance of the intermediate node of the second LC ladder network.

In one embodiment, the first parasitic capacitance is the largest capacitance in the first LC ladder network, and wherein the second parasitic capacitance is the largest capacitance in the second LC ladder network.

In one embodiment, the first stage is a power amplifier, low noise amplifier, or mixer.

In another embodiment, the present invention includes a method of processing an electronic signal comprising generating first and second differential signals in a first stage at first and second output terminals, processing the first differential signal in a first passive network having an input terminal coupled to the first output terminal of the differential stage, the first passive network comprising a first resistive load, processing the second differential signal in a second passive network having an input terminal coupled to the second output terminal of the differential stage, the second passive network comprising a second resistive load, injecting a first current into at least one node of the first passive network based on a voltage on at least one node of the second passive network, and injecting a second current into at least one node of the second passive network based on a voltage on at least one node of the first passive network.

In one embodiment, the first current is coupled to the first resistive load based on a voltage at the input of the second passive network, and the second current is coupled to the second resistive load based on a voltage at the input of the first passive network.

In one embodiment, the method further comprises injecting a third current into the input of the first passive network based on a voltage on the second resistive load of the second passive network, and injecting a fourth current into the input of the second passive network based on a voltage on the first resistive load of the first passive network.

The following detailed description and accompanying drawings provide a better understanding of the nature and advantages of the present invention.

DETAILED DESCRIPTION

Described herein are circuits and methods for use in wideband circuits. In the following description, for purposes of explanation, numerous examples and specific details are set forth in order to provide a thorough understanding of the present invention. However, it will be evident to one skilled in the art that embodiments of the present invention may include other equivalent embodiments or basic modifications of the examples shown below. For example, while the embodiments and examples below are presented using NMOS transistors, other transistors suitable for high frequencies may be used. Thus, the invention, as defined by the claims, may include some or all of the features in these examples alone or in combination with other features described below along with equivalents.

Figure 1A:
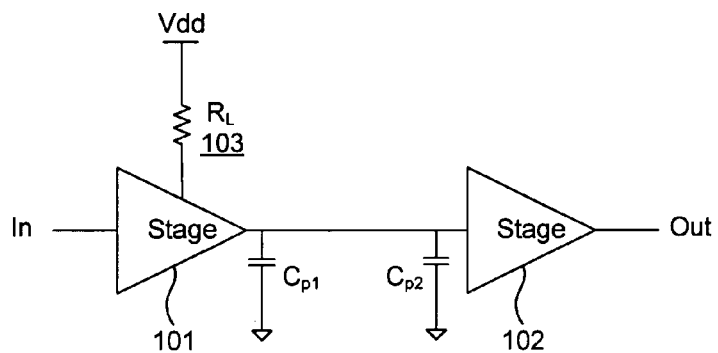
FIG. 1A illustrates multiple circuit stages.
Figure 1B:
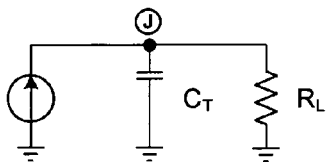
FIG. 1B illustrates the bandwidth limitation caused by parasitic capacitance in circuit stages.
Figure 1B:
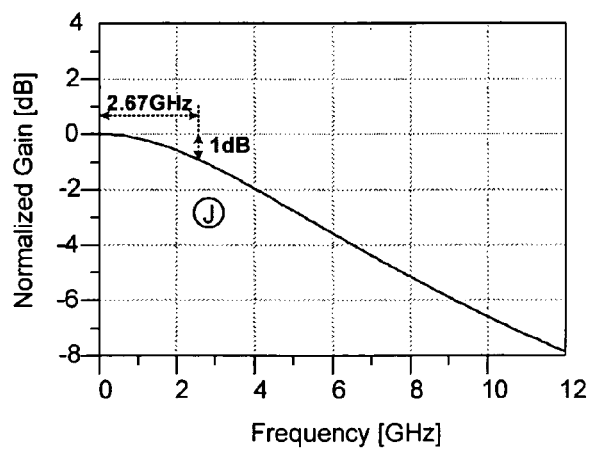
Figure 1C:
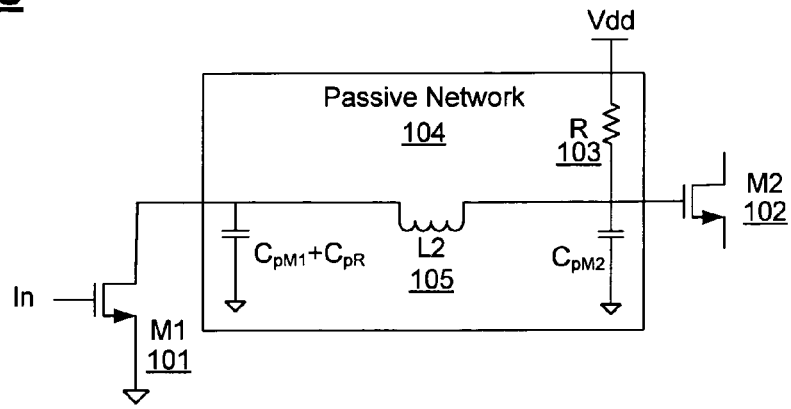
FIG. 1C shows a prior art $3^{rd}$ order network having a network input connected to the output of the first stage and a network output connected to the input of the second stage.
Figure 1D:
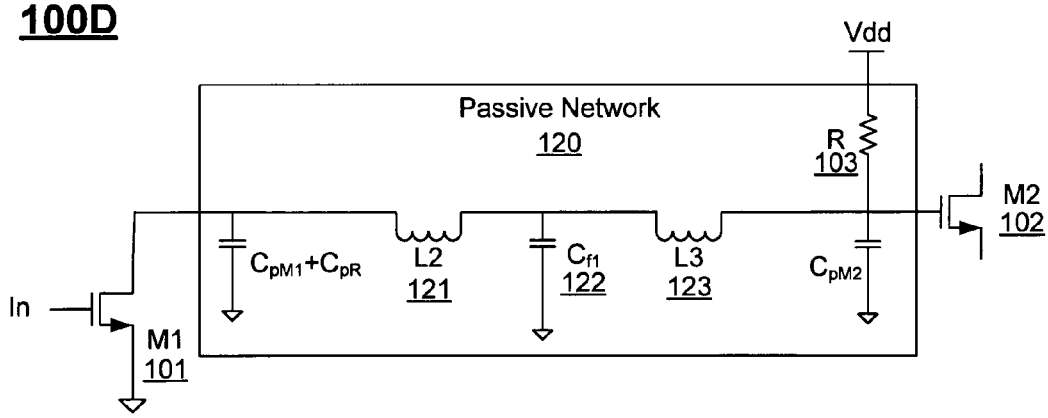
FIG. 1D shows a prior art $5^{rd}$ order network having a network input connected to the output of the first stage and a network output connected to the input of the second stage.
Figure 2A:
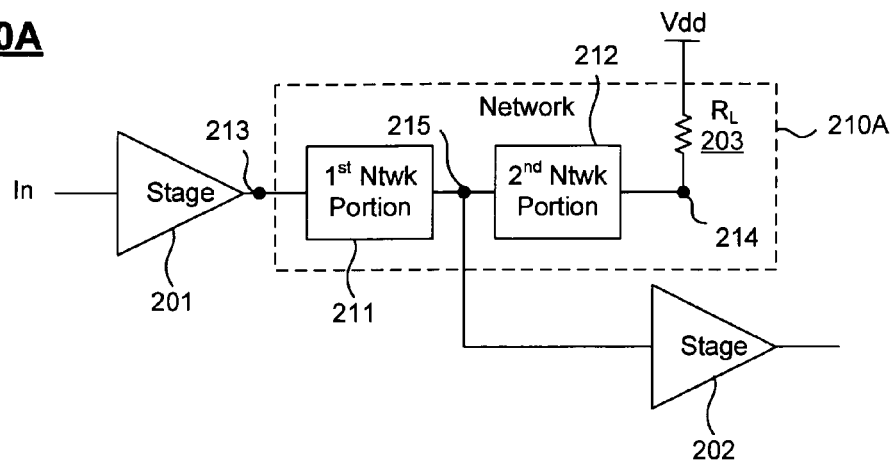
FIG. 2A illustrates a wideband circuit according to one embodiment of the present invention.

FIG. 2A illustrates a wideband circuit according to one embodiment of the present invention. Wideband circuit 200A includes a first stage 201, a second stage 202, and a network 210A. Stage 201 receives an input signal "In" and generates an output signal at an output terminal. Network 210A includes an input terminal 213, a first network portion 211, a second network portion 212, a last node 214, and a resistor 203. The output terminal of stage 201 is coupled to the input terminal 213 of network 210A. Resistor 203 is coupled to the last node 214 of network 210A, and may set the gain of stage 201. In the example shown in FIG. 2A, the first network portion 211 is a single-ended two-port network, which means that the first network portion has one input terminal and one output terminal. The second network portion 212 is a single-port network including resistor 203, which means that the second network portion has one input terminal that provides impedance loading, but has no output terminal. While the present example illustrates one embodiment of the invention in terms of a single-ended circuit, differential circuits could also be used as illustrated below. The first and second network portions 211 and 212 are coupled together at intermediate node 215. An intermediate node is a circuit node that is separated from the input node by at least one component and separated from the last node by at least one component. Stage 202 includes an input terminal that is coupled to an intermediate node 215 of network 210A.

The output terminal of stage 201 has a corresponding first parasitic capacitance. Similarly, input terminal of stage 202 has a corresponding second parasitic capacitance. The first parasitic capacitance may be included as the input capacitance of the network, and the second parasitic capacitance may be included as the capacitance of the intermediate node of the network. As described in more detail below, for a given parasitic capacitance at the input terminal of the second stage and a particular resistance value for resistor 203, the intermediate node may provide a wider bandwidth than the bandwidth available at the last node of network 210A. The response of network 210A can be tailored to provide a frequency response at the intermediate node that is substantially flat up to the corner frequency of the network. Various implementations and embodiments of the present invention may include different corner frequencies and different amounts of ripple. In one embodiment, the network may be set to have a frequency response at the intermediate node having less than three decibels (3 dB) of ripple from a first low frequency (e.g., 0 Hz) to the corner frequency of the network. In another embodiment, the corner frequency may be defined as the frequency at which the output is attenuated by one decibel (1 dB), and the ripple may be about 1 dB or less. For example, in a wireless application the first low frequency may be less than three (3) gigahertz and the 1 dB corner frequency may be at least ten (10) gigahertz.

Figure 2B:
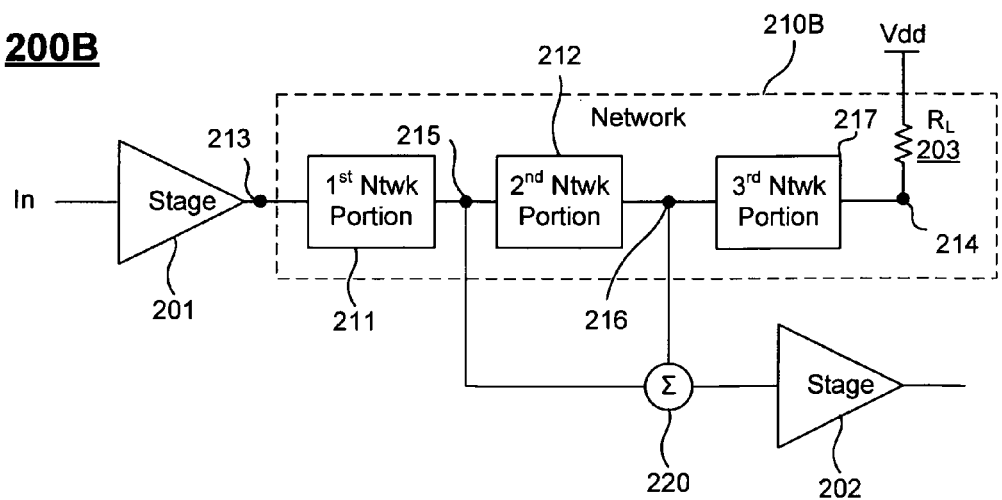
FIG. 2B illustrates a wideband circuit according to another embodiment of the present invention.

FIG. 2B illustrates a wideband circuit according to another embodiment of the present invention. Wideband circuit 200B includes a first stage 201, a second stage 202, and a network 210B. Stage 201 receives an input signal "In" and generates an output signal at an output terminal. Network 210B includes an input terminal 213, a first network portion 211, a second network portion 212, a third network portion 217, a last node 214, and a resistor 203. The output terminal of stage 201 is coupled to the input terminal 213 of network 210B. Resistor 203 is coupled to the last node 214 of network 210B, and may set the gain of stage 201. In the example shown in FIG. 2B, the first and second network portions 211-212 are single-ended two-port networks. The third network portion 217 is a single-port network including resistor 203. The first and second network portions 211 and 212 are coupled together at intermediate node 215, and the second and third network portions 212 and 217 are coupled together at intermediate node 216. Stage 202 includes an input terminal that is coupled to both intermediate nodes 215 and 216 of network 210B through an adding circuit 220. Thus, the signals at the intermediate nodes may be added together and provided to stage 202. Accordingly, embodiments of the present invention may combine different signals from different portions of network 210B to achieve a desired bandwidth and passband response.

In one embodiment, networks 210A and 210B are ladder networks. A ladder network is a network with an input node and a series of components coupled together at one or more nodes, and each node further has a component coupled to a reference voltage such as ground. An example ladder network is a series of inductors coupled together between an input node and a last node, with the nodes between the inductors being intermediate nodes of the network. All of the nodes in the ladder may have a capacitance to ground, for example. The ladder network may further have a resistor coupled between the last node and a reference voltage.

Figure 3:
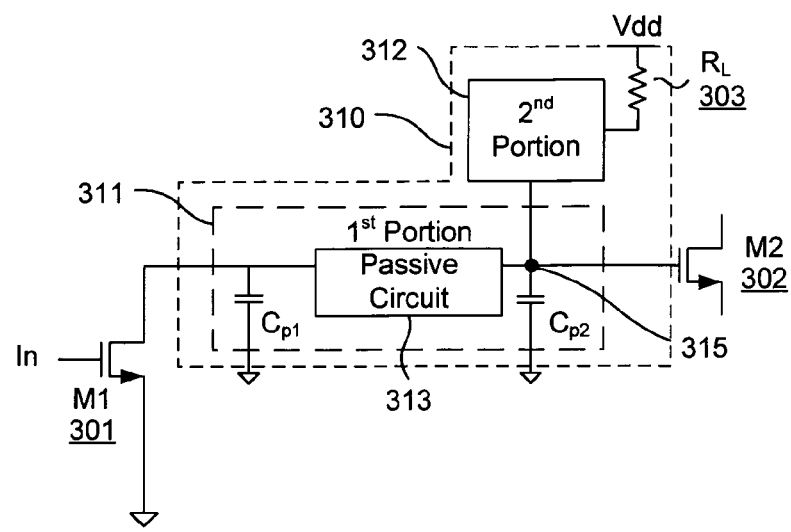
FIG. 3 is an example of a wideband circuit used to couple a signal between the drain of a transistor and the gate of another transistor.

FIG. 3 is an example of a wideband circuit used to couple a signal between the drain of a transistor and the gate of another transistor. Wideband circuit 300 illustrates how the output parasitic capacitance and input parasitic capacitance may be included in the network to enhance bandwidth. In this example, the first stage includes a MOS transistor (M1) 301, which provides an output signal on a drain terminal. The second stage is also a MOS transistor (M2) 302, which receives a signal that has been processed by network 310. In this example, network 310 is a passive network having an input terminal coupled to the drain of transistor 301 and an intermediate node 315 coupled to the gate of transistor 302. While this example illustrates the input of the second stage being a gate terminal, other second stage input configurations may be used. The drain terminal of transistor 301 will have a corresponding parasitic capacitance $C_{p1}$. Similarly, the gate terminal of transistor 302 will have a corresponding parasitic capacitance $C_{p2}$. A passive circuit 313 may be included between the drain terminal and intermediate node 315. A variety of passive circuits may be used based on design criteria. The combined network 310 is preferably a fourth order or greater network (i.e., 4th order, 5th order, etc. ... ). The order of the network is determined from the number of energy storage elements in the network (e.g., inductors and capacitances) including the parasitic capacitances. The parasitic drain capacitance is incorporated as the input capacitance of passive circuit 313, and the parasitic gate capacitance is incorporated as the capacitance of the intermediate node 315. The intermediate node is also coupled to the input of a second network portion 312, which may also be a passive network. Network portion 312 includes a resistor 303 connected at a last node in the network. Resistor 303 may set the gain of the M1 stage, for example. Network 310 may be designed and customized for maximum bandwidth at intermediate node 315 for given values of resistance, parasitic drain capacitance, and parasitic gate capacitance. As illustrated in more detail below, for a given parasitic gate capacitance and resistor value, the circuit bandwidth at the gate of M2 may be greater than the bandwidth available if the gate of M2 were connected to resistor 303 at the last node in network 310. Therefore, larger second stage input devices may be used, for example.

Figure 4A:
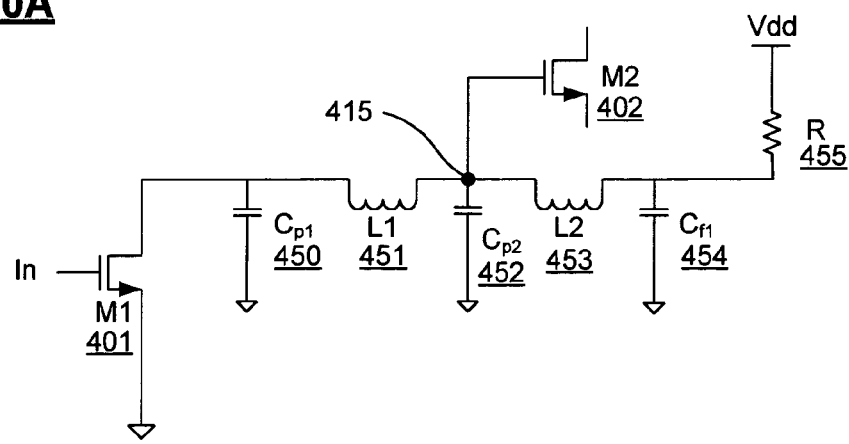
FIG. 4A is an example of a wideband circuit according to one embodiment of the present invention.

FIG. 4A is an example of a wideband circuit according to one embodiment of the present invention. In this example, the first stage includes a MOS transistor (M1) 401 having a corresponding parasitic capacitance ($C_{p1}$) 450. Similarly, the second stage includes a MOS transistor (M2) 402 having a corresponding parasitic capacitance ($C_{p2}$) 452. The parasitic capacitances are included as part of a network comprising capacitance ($C_{p1}$) 450, inductor (L1) 451, capacitance ($C_{p2}$) 452, inductor (L2) 453, capacitance ($C_{f1}$) 454, and resistor (R) 455. Inductor 451 is coupled between the drain of M1 and intermediate node 415, which is coupled to the gate of M2. Inductor 453 is coupled between intermediate node 415 and the last node of the network, which is a first terminal of resistor 455. The second terminal of resistor 455 may be coupled to a reference voltage such as Vdd, for example. Capacitance 454 is also coupled between the last node and a reference voltage (e.g., ground). Capacitance 454 may be a parasitic capacitance or a capacitor component, for example. The parasitic capacitances and passive components in circuit 400A make up a 5th order ladder network. FIGS. 4B-F illustrate how an intermediate node in such a circuit may be used to obtain broader bandwidth for a system.

Figure 4B:
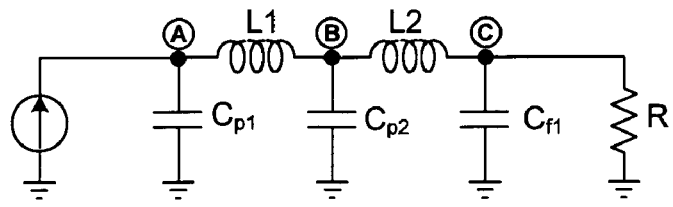
FIG. 4B is an equivalent circuit of the wideband circuit in FIG. 4A.

FIG. 4B is an equivalent circuit of the wideband circuit in FIG. 4A. For purposes of understanding the improvements of the present invention, specific example values for the components are provided in the following Table 1:

TABLE 1

| | |
|---|---|
| $C_{p1}$ | 530 fF |
| L1 | 1.27 nH |
| $C_{p2}$ | 634 fF |
| L2 | 1.15 nH |
| $C_{f1}$ | 340 fF |
| R | 50 Ω |

Figure 4C:
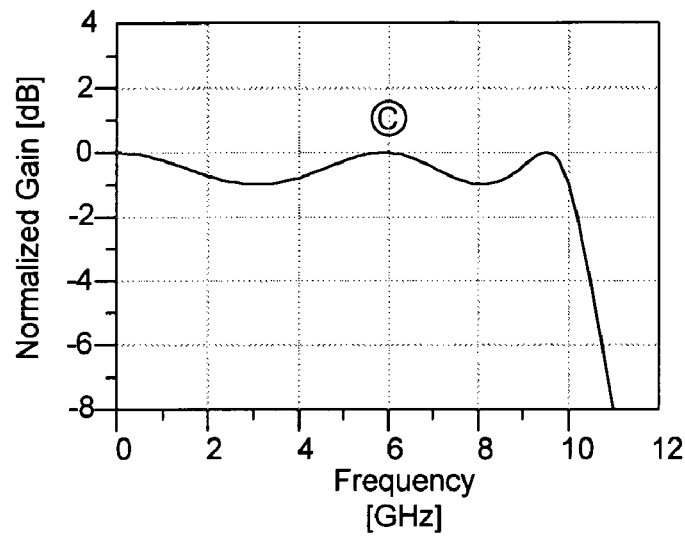
FIG. 4C shows the frequency response at the output node of the network in FIG. 4B for specific component values.
Figure 4D:
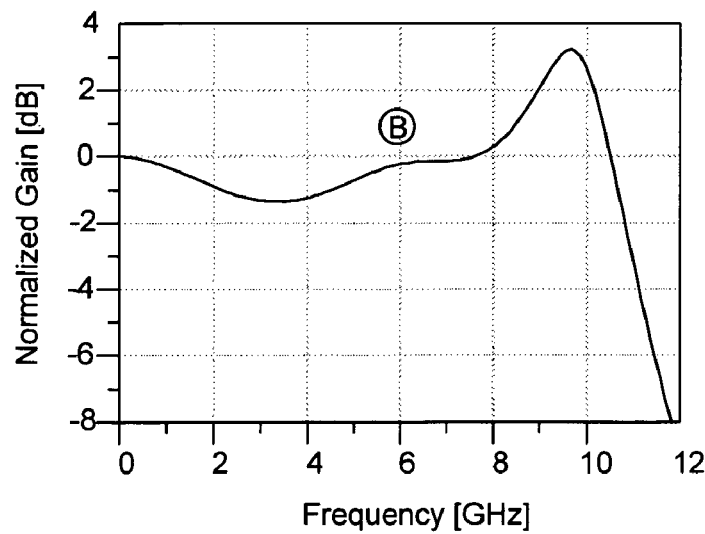
FIG. 4D shows the frequency response at an intermediate node of the network in FIG. 4B for specific component values.

The values for the above filter are based on a 5th order Chebyshev filter for the network with one decibel (1 dB) of ripple in the passband. FIG. 4C illustrates the frequency response of the circuit in FIG. 4B at the last node in the circuit (i.e., Node C). In this example, the frequency response is a transimpedance because the input of the network is a current and the output is a voltage. As shown in FIG. 4C, the circuit has a bandwidth of about 10 GHz. However, the circuit will only achieve this bandwidth if the capacitance at the last node is at 340 femtofarads. For practical applications, it may not be possible or desirable to have such low capacitance at the gate of the next stage. It has been noted that the capacitance at the intermediate node is almost double the capacitance at the last node. FIG. 4D shows the frequency response at the intermediate node of the network in FIG. 4B. From FIG. 4D it can be seen that there is peaking in the response at the intermediate node near the cutoff frequency. However, by tailoring the component values, the frequency response at the intermediate node may be flattened so that a wide bandwidth is achieved together with a higher capacitance tolerance.

Figure 4E:
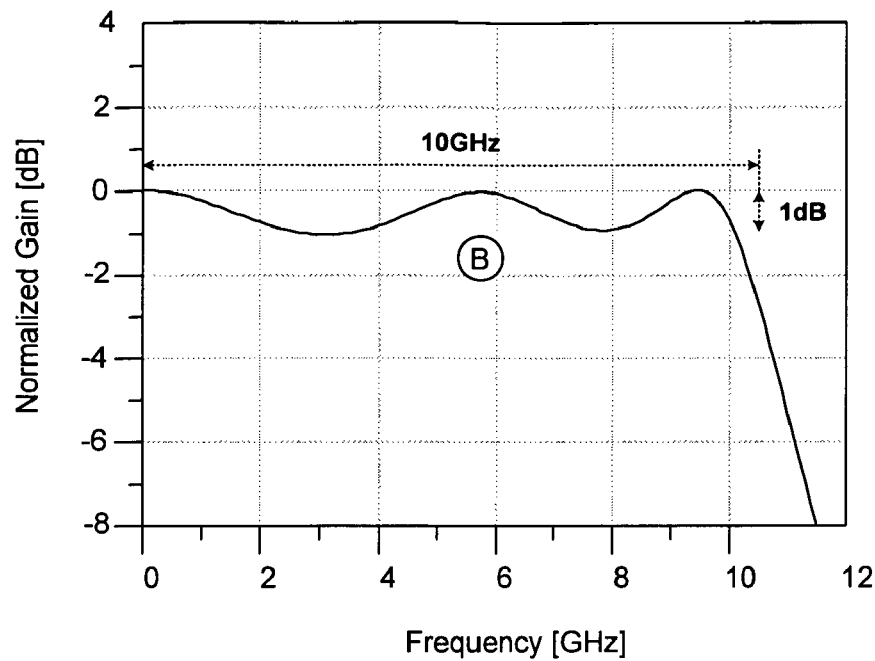
FIG. 4E shows the frequency response at the intermediate node of the network in FIG. 4B for specific component values.

FIG. 4E shows the frequency response at the intermediate node of the network in FIG. 4B after the component values have been adjusted for a flat bandwidth. The component values for the circuit in FIG. 4B that result in the frequency response in FIG. 4E are shown in Table 2:

TABLE 2

| | |
|---|---|
| $C_{p1}$ | 570 fF |
| L1 | 1.41 nH |
| $C_{p2}$ | 600 fF |
| L2 | 1.11 nH |
| $C_{f1}$ | 332 fF |
| R | 50 Ω |

This example illustrates that a wide bandwidth may be achieved at the same gain level (i.e., the same value of resistor R) but with a substantial increase in tolerance for the capacitance of the second stage. It should also be noted that the tolerance on the input capacitance has increased. To illustrate this improvement further, it is useful to compare prior art techniques to the embodiment of the present invention illustrated by this example. According to prior techniques, the input of the second stage was connected to the last node in the network, which was considered the output in the prior art. If a second stage has a fixed parasitic capacitance of 600 fF, and if the gate input of the second stage is connected to the last node of a 5th order Chebyshev filter network, then the other component values are as shown in Table 3.

TABLE 3

| | |
|---|---|
| $C_{p1}$ | 935 fF |
| L1 | 2.23 nH |
| $C_{f1}$ | 1120 fF |
| L2 | 2.03 nH |
| $C_{p2}$ | 600 fF |
| R | 50 Ω |

Figure 4F:
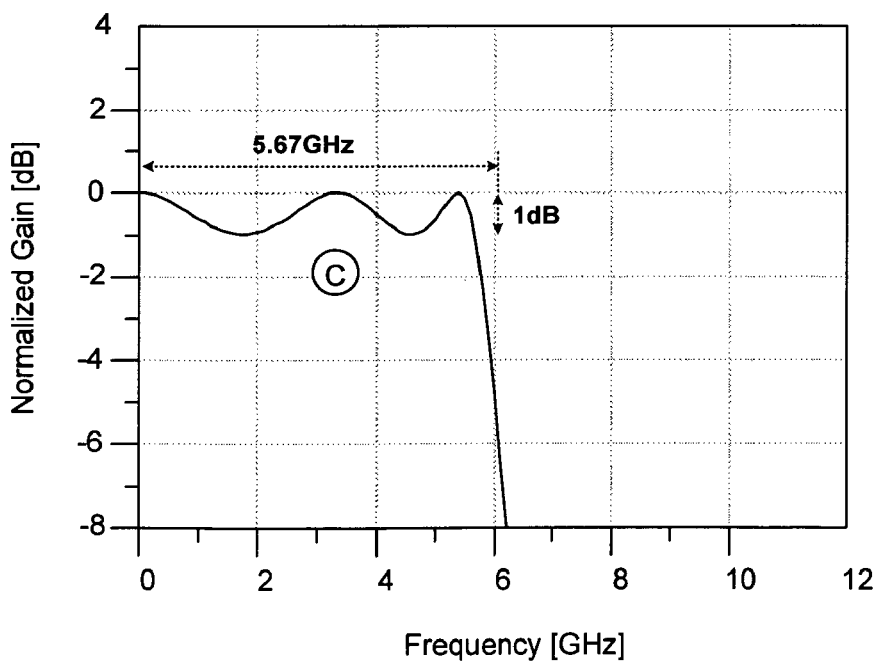
FIG. 4F shows the frequency response at the output node of the network in FIG. 4B for specific component values.

Note that in the prior art, the input to the second stage was not coupled to an intermediate node, but rather, to the last node of the network. Thus, in Table 3 the parasitic capacitance of the second stage $C_{p2}$ changes position with capacitor $C_{f1}$. The bandwidth of the circuit for Table 3 is shown in FIG. 4F. Comparing component values in Tables 2 and 3 and the frequency responses shown in FIGS. 4E and 4F it is clear that for a given second stage capacitance, the bandwidth of the circuit will be substantially less if the second stage is connected to the last node in the network. However, more capacitance can be tolerated if the second stage is coupled to an intermediate node. In particular, for an input capacitance of 600 fF, the bandwidth of the circuit in FIG. 4E is 10 GHz, but the bandwidth of the circuit in FIG. 4F is only about 5.5 GHz.

The above example also illustrates another embodiment of the invention where the parasitic capacitance of the second stage (e.g., $C_{p2}$) is the largest capacitance in the network. In this case, the other component values can be optimized for maximum frequency response between the input of the network and the intermediate node. In the example above, the network was initially configured as a $5^{th}$ order Chebyshev filter. The filter components were selected based on a gain, bandwidth, and parasitic capacitance constraints. The component values may then be modified so that the frequency response at the desired intermediate node is "flattened" to provide a substantially flat passband up to the corner frequency of the network. The corner frequency is typically the frequency above which the frequency response (e.g., the transimpedance) of the network is below some desired level (e.g., 1 dB or 3 dB). The passband of the circuit is the range of frequencies where the signal passes substantially unattenuated (e.g., less than 3 dB attenuation). Different applications may have different requirements for ripple in the passband. In one application, the network may be set to have a frequency response at the intermediate node having less than three decibels (3 dB) of ripple from a first low frequency (e.g., 0 Hz) to the corner frequency of the network. In some embodiments, the components in the filter may be selected to achieve even less ripple, such as about 1.5 dB or 1 dB of ripple. In a wireless application, the components may be tailored to be substantially flat from a low frequency of less than three (3) gigahertz and a corner frequency as high as ten (10) gigahertz. While the above component values were obtained from a Chebyshev filter, it is to be understood that other filters, such as Butterworth or Bessel filters for example, could be used to obtain the initial values for the components.

Figure 5:
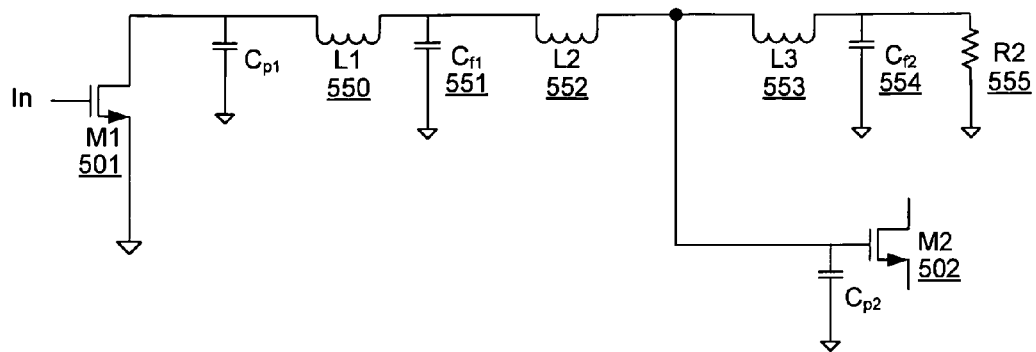
FIG. 5 is an example of a wideband circuit according to one embodiment of the present invention.

FIG. 5 is an example of a wideband circuit according to one embodiment of the present invention. Circuit 500 is an example of a $7^{th}$ order ladder network. Circuit 500 includes a first stage comprising an output transistor 501, passive network, and a second stage comprising an input transistor 502. The passive network includes a parasitic capacitance of the first stage $C_{p1}$, inductor 550, capacitor 551, inductor 552, the parasitic capacitance $C_{p2}$ of the second stage transistor 502, inductor 553, capacitor 554, and a resistor 555 coupled to the last node in the network. The parasitic capacitance of the drain of transistor 501 is included as the input capacitance of the passive network together with other possible parasitic capacitances corresponding to the first stage output node such as routing capacitance, for example. Inductors 550 and 551 are coupled in series between the first stage output terminal and the intermediate node coupled to the gate of transistor 502. Inductor 553 is coupled between the intermediate node and a first terminal of load resistor 555. Higher order networks may include additional inductors between the input node and output node of the network. The node between inductors 550 and 552 is also an intermediate node in the circuit. However, the intermediate node between inductors 550 and 552 is coupled to one terminal of capacitor 551. The other terminal of capacitor 551 is coupled to ground. Similarly, the last node between inductor 553 and resistor 555 is coupled to one terminal of capacitor 554, and the other terminal of capacitor 554 is coupled to ground. The intermediate node between inductors 552 and 553 is coupled to the gate of transistor 502. Therefore, the parasitic capacitance from the gate is included as the capacitance of the intermediate node of the network. As mentioned above, techniques for obtaining component values may include initially treating the network as a filter, such as a Chebyshev. Component values for a given bandwidth at the last node may be obtained. Then, the response at the gate of transistor 502 may then be flattened by modifying the component values using numerical methods. For a given value of resistance and parasitic capacitance at the gate of transistor 502, the frequency response at the intermediate node may be very large when the parasitic capacitance from the gate of transistor 502 is the largest capacitance in the network.

Figure 6:
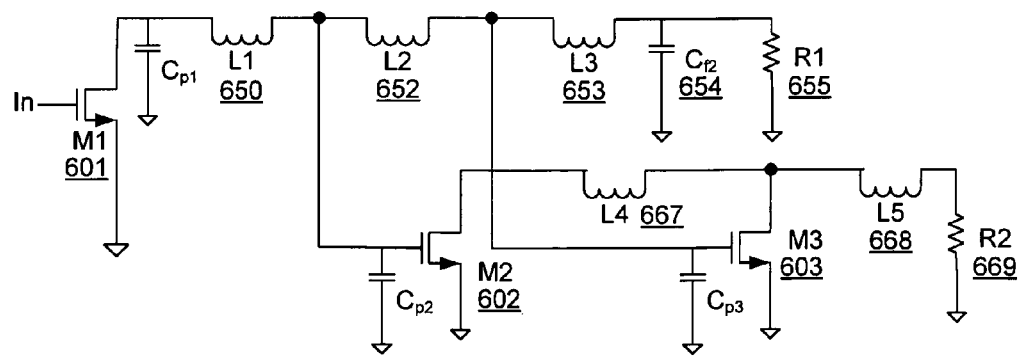
FIG. 6 is an example of a wideband circuit according to another embodiment of the present invention.

FIG. 6 is an example of a wideband circuit according to another embodiment of the present invention. Circuit 600 is an example of a $7^{th}$ order ladder network that is substantially the same as in FIG. 5. However, the second stage in this circuit includes two input transistors 602 and 603. As in FIG. 5, transistor 603 has a gate coupled to the intermediate node between inductor (L2) 652 and inductor (L3) 653, and the parasitic capacitance from the gate of transistor 603 is included as the capacitance of the intermediate node between L2 and L3. Additionally, transistor 602 has a gate coupled to the intermediate node between inductor (L1) 650 and inductor (L2) 652, and the parasitic capacitance from the gate of transistor 602 is included as the capacitance of the intermediate node between L1 and L2. The voltages at the intermediate nodes will be translated into currents at the drains of transistors 602 and 603. These currents may be added using the network comprising inductor 667, inductor 668, and resistor 669, for example. It is to be understood that this example is only one technique for adding signals from multiple intermediate nodes. Other techniques may be used for adding the currents. The frequency responses at the intermediate nodes may be tailored to obtain substantially flat wide bandwidth. In this example, an attenuated signal frequency at one intermediate node may be summed with an amplified signal frequency at the other intermediate node to cancel out the attenuation and extend the bandwidth. For example, one intermediate node may include peaking near the corner frequency to extend the bandwidth, and the other intermediate node may be rolling off at such frequency. However, when the signals are added together, the peaking may be cancelled to achieve substantially flat bandwidth across the frequency range of interest.

Figure 7:
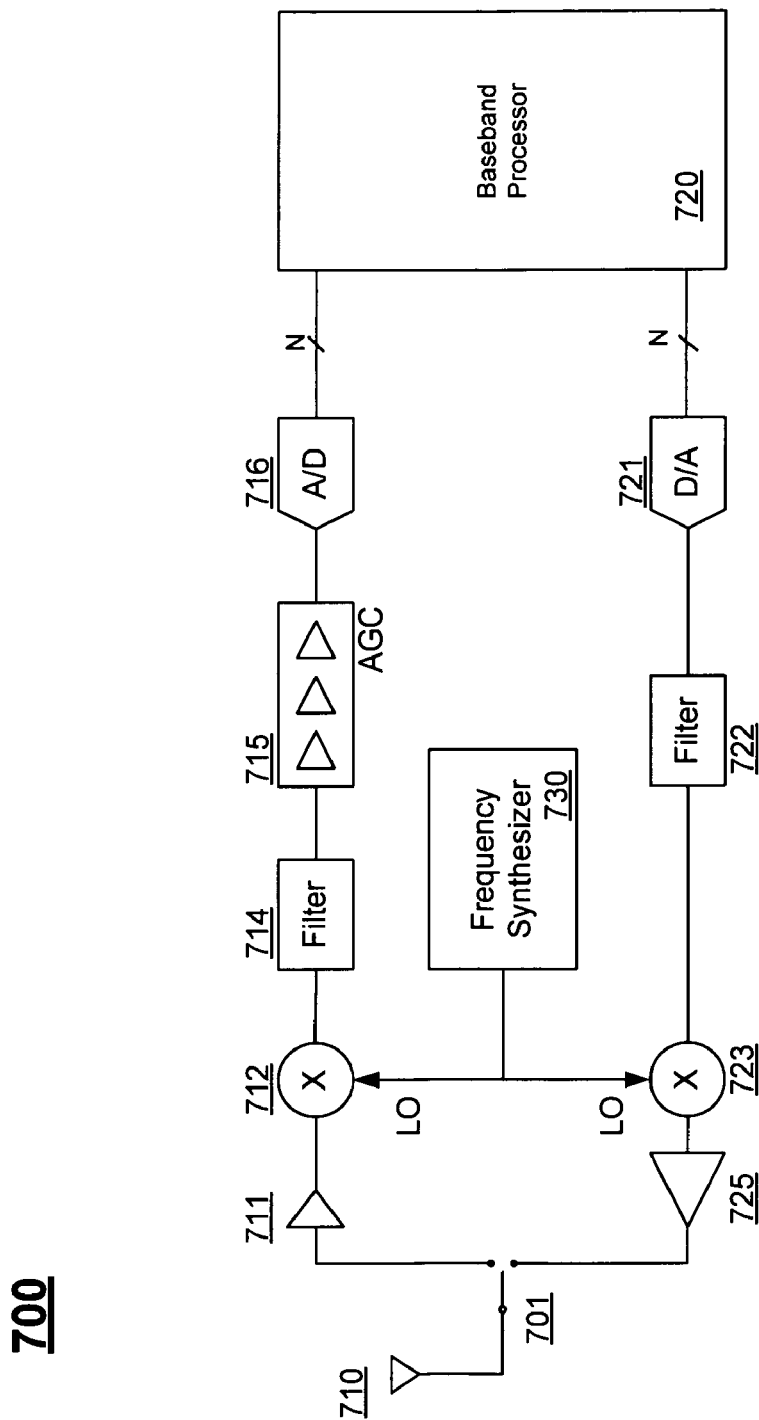
FIG. 7 is an example of a wireless system including a wideband circuit according to one embodiment of the present invention.

FIG. 7 is an example of a wireless system including a wideband circuit according to one embodiment of the present invention. FIG. 7 is an example of a direct conversion architecture that may use embodiments of the present invention. Wireless system 700 includes antenna 710 coupled through a switch 701 to both a reception channel and a transmission channel. The reception channel includes a low noise amplifier 711 ("LNA"), mixer 712, frequency synthesizer 730, filter 714, automatic gain control 715 ("AGC") and analog-to-digital converter 716 ("A/D"). LNA 711 is used for amplifying high frequency signals from antenna 710 and must have sufficient bandwidth, gain and noise performance to meet system requirements. In one embodiment, the present invention includes an LNA stage coupled to a mixer stage using wideband circuit techniques described above. Mixer 712 also receives a local oscillator signal ("LO") from frequency synthesizer 730 at the carrier frequency and demodulates the RF input signal from the LNA 711. The reception channel may include two mixers and parallel paths thereafter for both in-phase and quadrature paths (only one path is shown). In a direct conversion system, the input signal is demodulated down to baseband, and no intermediate frequencies are used. It is to be understood that embodiments of the present invention may be used in either a direct conversion system or a system using intermediate frequencies. Filter 714 is used to extract the signal of interest from the demodulated signal, and AGC 715 provides appropriate gain so that the input to A/D 716 is as close as possible to the A/D's full range. The output of the reception channel is coupled to baseband processor 720 over N-bit digital signal lines, for example, for decoding and further processing.

During transmission, baseband processor 720 encodes a voice or data signal. The encoded signal is received by digital-to-analog converter 721 ("D/A") as an N-bit digital signal, for example, and is converted into an analog signal. The output of D/A 721 is passed through filter 722 and mixer 723. Mixer 723 receives a local oscillator signal ("LO") from frequency synthesizer 730 at the carrier frequency, and the input to the mixer is modulated by LO to produce a modulated output signal. The system may include two transmission paths for both in-phase and quadrature signals (not shown) that are added together prior to amplification. The modulated mixer output signal is received by power amplifier 725, which amplifies the power in the signal to drive antenna 710. In another embodiment, the present invention includes a mixer stage coupled to an amplifier stage using wideband circuit techniques described above.

Figure 8:
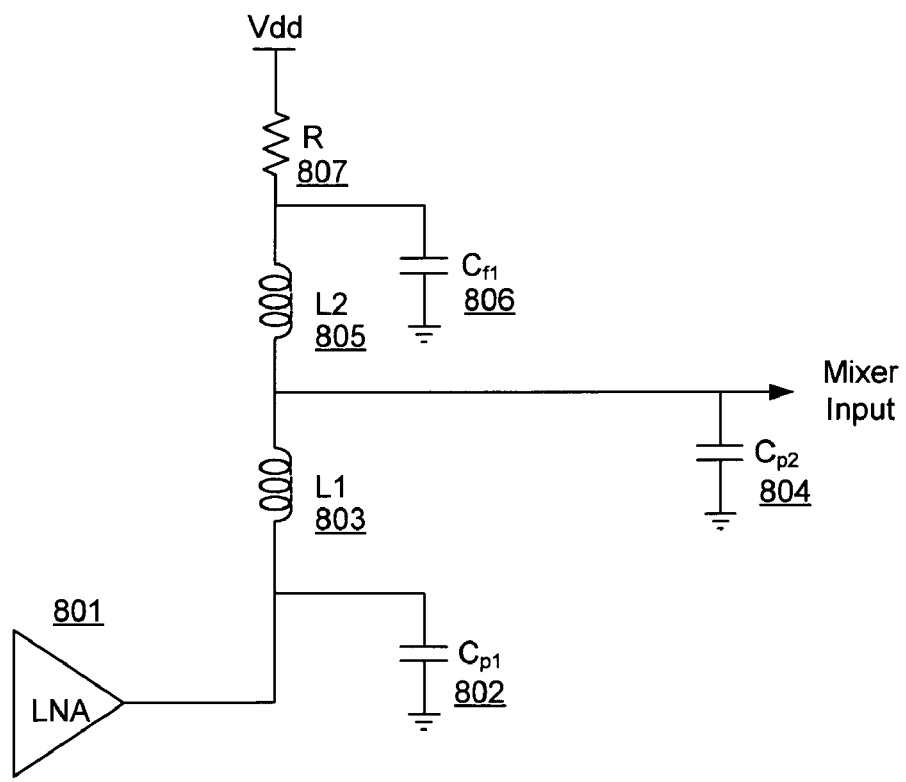
FIG. 8 is an example of a low noise amplifier including a wideband circuit according to another embodiment of the present invention.

FIG. 8 is an example of a low noise amplifier including a wideband circuit according to another embodiment of the present invention. A low noise amplifier ("LNA") 801 generates an output signal at an output terminal. The output terminal has a corresponding parasitic capacitance ($C_{p1}$) 802. The signal from the LNA is processed in a network having an input terminal coupled to the output terminal of the LNA. The network in this example includes parasitic capacitance 802, inductor (L1) 803, inductor (L2) 805, capacitance ($C_{f1}$) 806, resistor (R) 807, and a parasitic capacitance ($C_{p2}$) 804 corresponding to the input of one or more mixer circuits. The parasitic capacitances may include drain capacitance, gate capacitance, or routing capacitances, for example. In the network in circuit 800, capacitance 806 is purely parasitic, which may be caused by routing capacitance between inductor 805 and resistor 807. The input to the mixer stage is couple to an intermediate node of the network rather than to the last node of the network at resistor 807. The network therefore processes the signal at the output of the LNA, and the processed signal is received by the mixer from an intermediate node. The intermediate node may have a wide bandwidth where the parasitic capacitance of the mixer input is the largest capacitance in the network. Table 4 shows example values for components that may be used.

TABLE 4

| | |
|---|---|
| $C_{p1}$ | 75 fF |
| L1 | 2.5 nH |
| $C_{p2}$ | 190 fF |
| L2 | 3.8 nH |
| $C_{f1}$ | 27 fF |
| R | 70 Ω |

Figure 9:
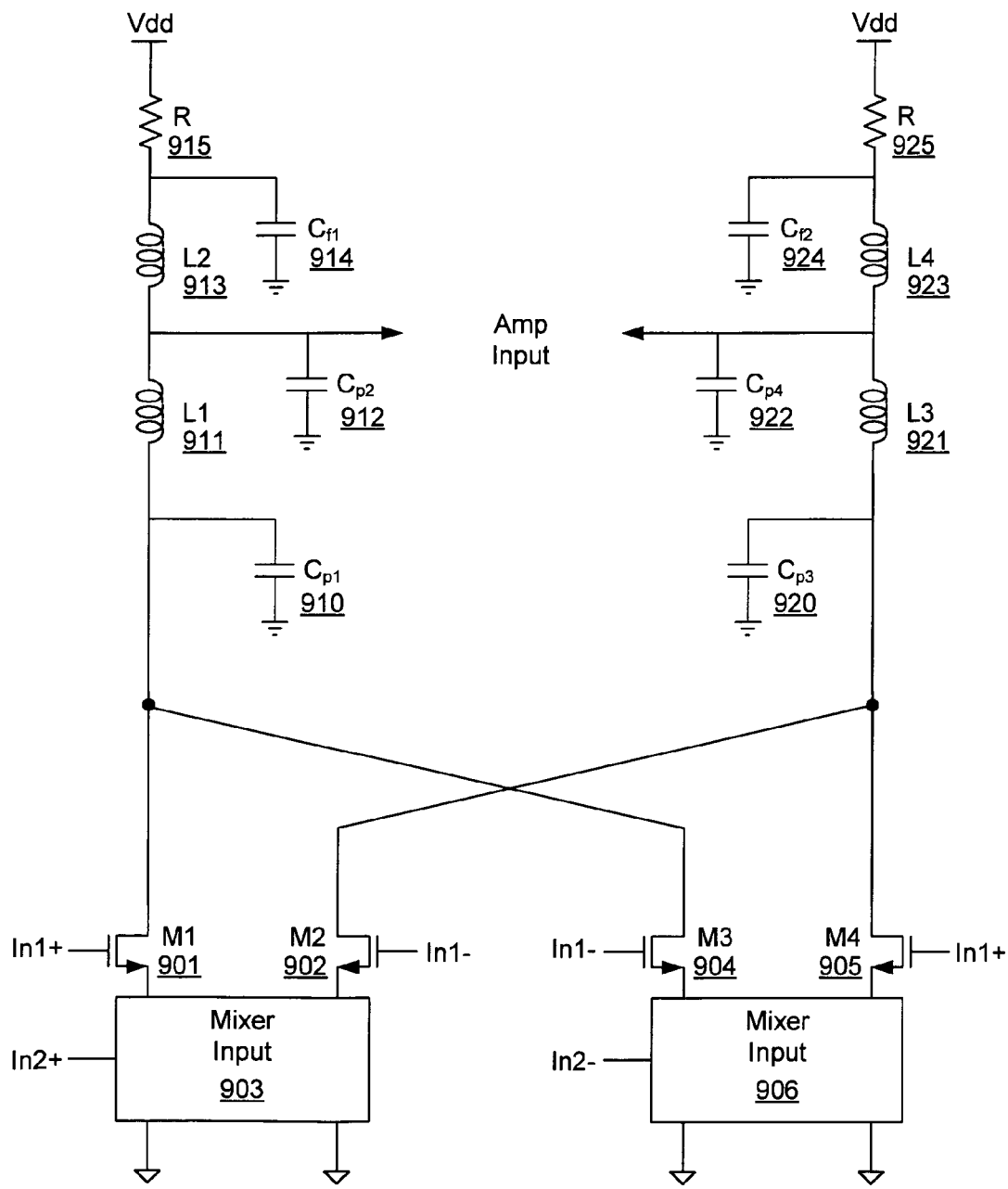
FIG. 9 is an example of a mixer including a wideband circuit according to another embodiment of the present invention.

FIG. 9 is an example of a mixer including a wideband circuit according to another embodiment of the present invention. Mixer 900 includes cross-coupled stages comprising transistors 901-902 and 904-905. Each mixer stage includes a mixer input circuit 903 and 906. Mixer 900 receives a differential input signal (in2+, in2−), which is modulated by a local oscillator signal (in1+, in1−). Each stage generates differential currents that may be added together by coupling the outputs to common loads. Here, the common load is provided by two wideband networks of the type described above. The outputs of transistors 901 and 904 are coupled to a first network comprising parasitic capacitance ($C_{p1}$) 910, inductor (L1) 911, inductor (L2) 913, capacitance ($C_{f1}$) 914, resistor (R) 915, and a parasitic capacitance ($C_{p2}$) 912 corresponding to one input of a differential amplifier stage. Similarly, the outputs of transistors 902 and 905 are coupled to a second network comprising parasitic capacitance ($C_{p3}$) 920, inductor (L3) 921, inductor (L4) 923, capacitance ($C_{f2}$) 924, resistor (R) 925, and a parasitic capacitance ($C_{p4}$) 922 corresponding to a second input of a differential amplifier stage. Parasitic capacitances 910 and 920 may result from the combined drain capacitances of the mixer outputs and routing capacitances, for example. From FIG. 9 it can be seen that the wideband networks are symmetric ladder networks. Table 5 illustrates example values for the components of the networks, and further illustrates that wideband performance may be achieved when the parasitic capacitance included at the intermediate nodes of the network are the largest capacitances in the network.

TABLE 5

| | |
|---|---|
| $C_{p1}$, $C_{p3}$ | 220 fF |
| L1, L3 | 3.8 nH |
| $C_{p2}$, $C_{p4}$ | 250 fF |
| L2, L4 | 2.5 nH |
| $C_{f1}$, $C_{f2}$ | 20 fF |
| R | 100 Ω |

Figure 10:
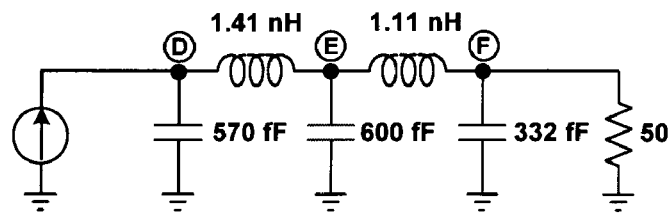
FIG. 10 shows the frequency response for the wideband circuit of FIG. 4E.
Figure 10:
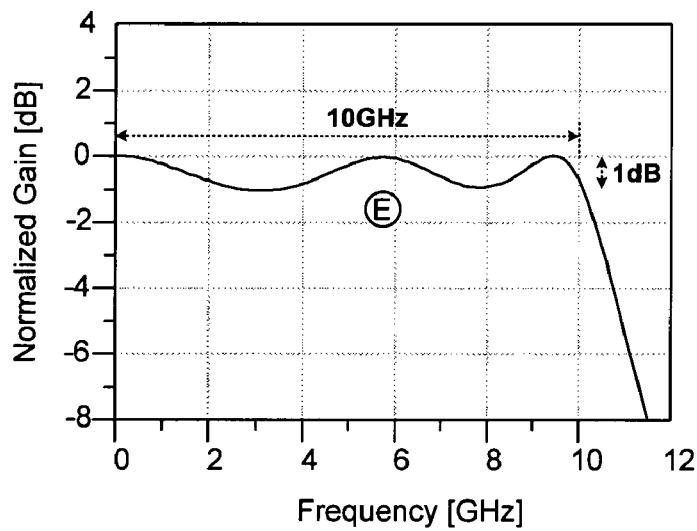
Figure 10:
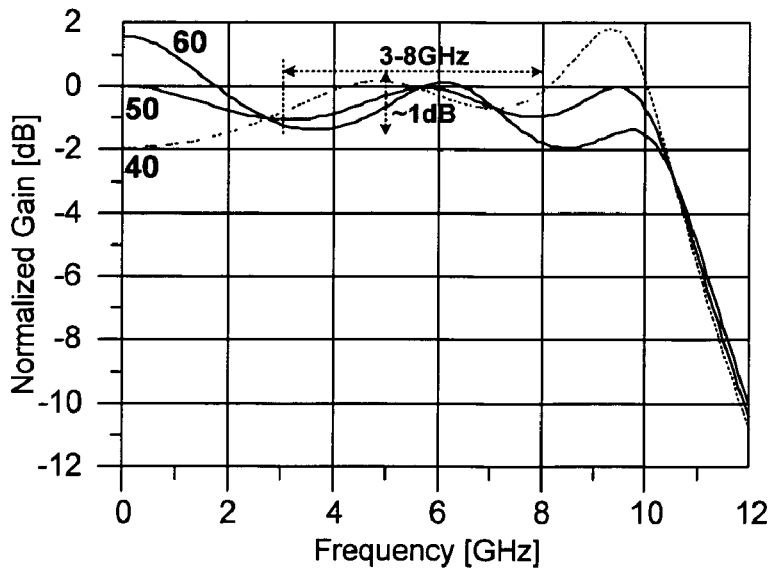

FIG. 10 shows the frequency response for the wideband circuit of FIG. 4E. From the diagram in FIG. 10, another advantage of embodiments of the invention is apparent. FIG. 10 shows the frequency response for three different values of resistance. One additional feature of some embodiments of the present invention is process insensitivity. For instance, characteristics of devices will change across manufacturing process runs. Resistors, for example, may vary by as much as 20% across process. FIG. 10 shows the frequency response (i.e., Z(f)=Vout/Iin) for three resistor values of R={40Ω, 50Ω, 60Ω}. The plot shows that from about 3 GHz to 8 GHz, the passband is extremely flat with about 1 dB of ripple for all values of resistance.

Figure 11A:
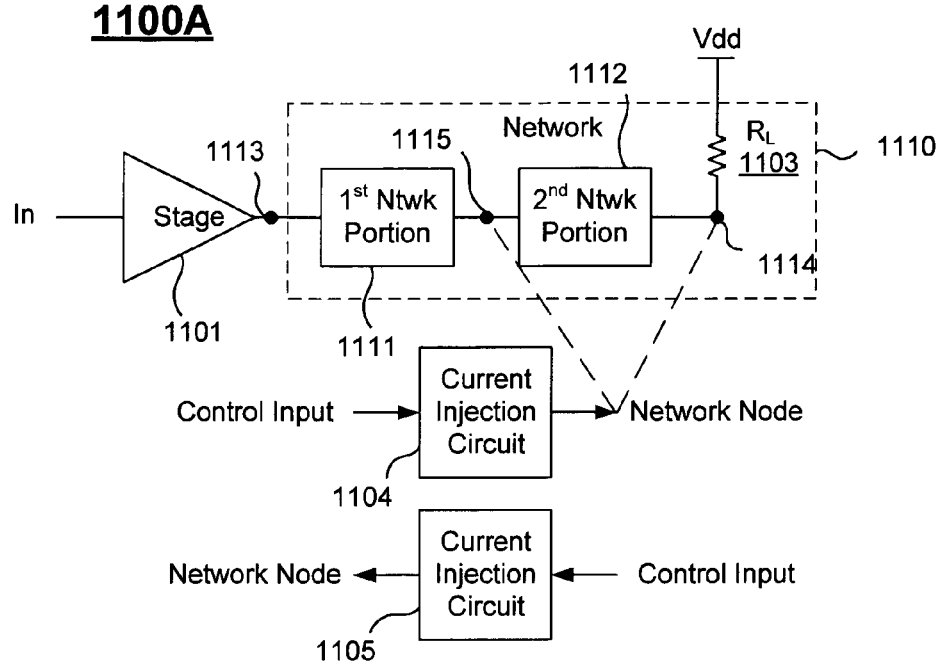
FIG. 11A illustrates a wideband circuit according to another embodiment of the present invention.

FIG. 11A illustrates a wideband circuit according to another embodiment of the present invention. Wideband circuit 1100A is an example of a single ended implementation of another embodiment of the present invention. Circuit 1100A includes a first stage 1101 that receives an input signal and provides an output signal. Stage 1101 may be an amplifier, mixer, or low noise amplifier, for example. The output of stage 1100A is coupled to a network 1110. Network 1110 may be a passive network of inductors and capacitors (e.g., parasitic capacitances or capacitors), and may include a resistive load 1103, for example. Network 1110 includes an input terminal 1103 coupled to the output of stage 1101. Network 1110 may include a first network portion 1111 coupled to a second network portion 1112 at an intermediate node 1115. In this embodiment, second network portion 1112 is coupled to resistive load 1103 at a last node in the network 1114. The other terminal of resistive load 1103 is coupled to a supply voltage Vdd. Embodiments of the present invention include injecting current into nodes of the network to increase the gain-bandwidth product of the circuit. For example, wideband circuit 1100A includes a current injection circuit 1104. Current injection circuit 1104 generates a current in response to signals (e.g., a voltage) received at the control input. The output of the current injection circuit may be coupled to any network node, and the control input may be coupled to any other network node. For example, in one embodiment, the control input is coupled to the input terminal of the network and the output is coupled to the last node. Accordingly, current injection circuit may inject current into last node 1114. Current injection circuit may inject AC or DC currents, or both, for example.

Figure 11B:
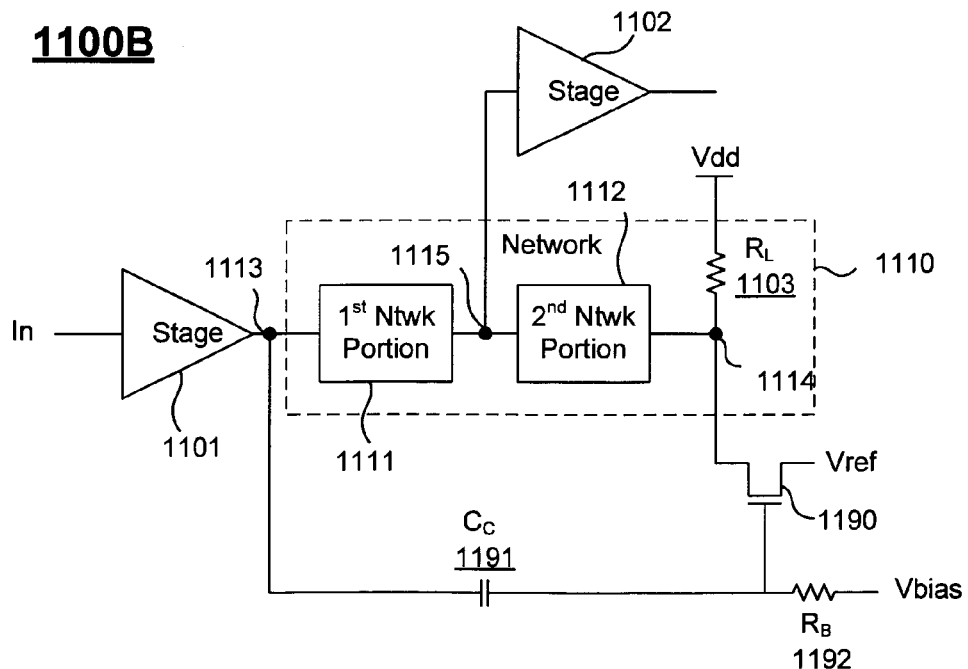
FIG. 11B is an example of a wideband circuit according to another embodiment of the present invention.

FIG. 11B is an example of a wideband circuit according to another embodiment of the present invention. In this example, current injection circuit comprises an MOS transistor 1190 having a control input coupled to the input terminal of network 1110, which is also coupled to the output of stage 1101. One terminal of transistor 1190 is coupled to a reference voltage (e.g., Vdd) and the other terminal of transistor 1190 is coupled to resistive load 1114, which in this example is also the last node of network 1110. In this example, transistor 1190 provides both a DC and AC signal to last node 1190. The gate of transistor 1190 is DC biased through resistor ("Rb") 1192. DC biasing will cause transistor 1190 to inject current into node 1114, which may allow the circuit to operate at lower power supply voltage levels, for example. The gate of transistor 1190 is AC coupled through capacitor ("Cc") 1191 to the output of stage 1113. Coupling the signal at the output of stage 1113, which is the input terminal of network 1110, may be used to extend the gain-bandwidth of the circuit. The input terminal of a subsequent stage 1102 may be coupled to intermediate node 1115, for example, as described above.

Figure 11C:
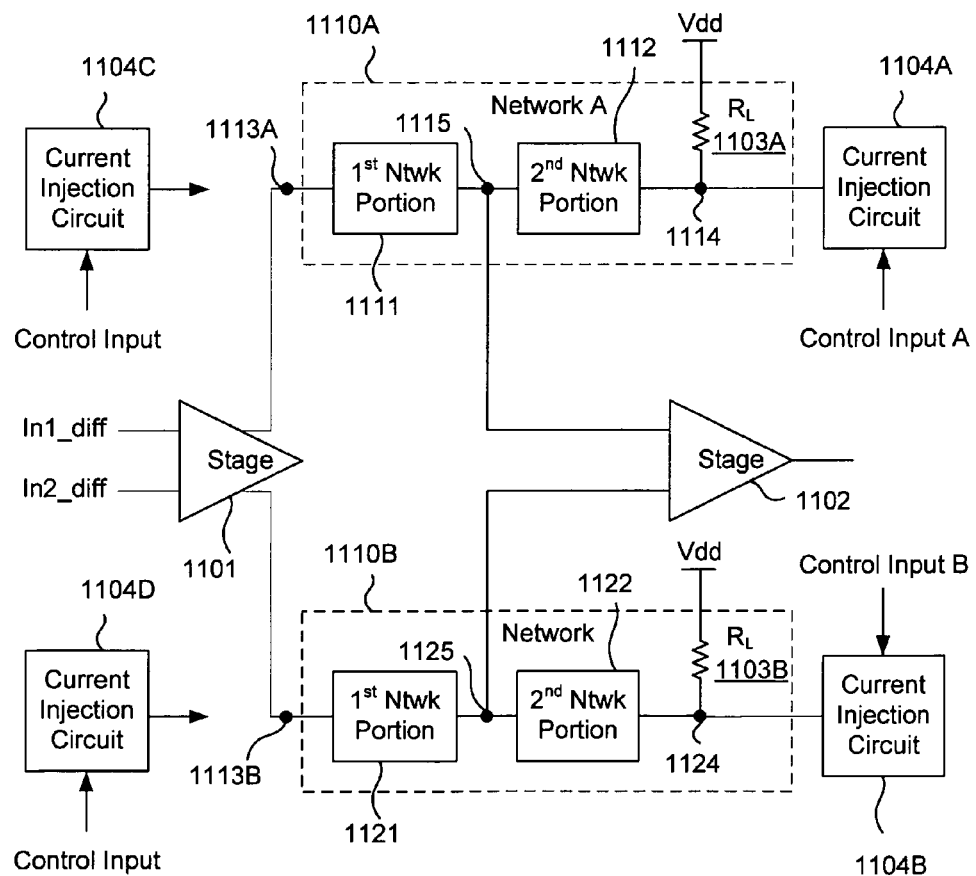
FIG. 11C is an example of a wideband circuit according to another embodiment of the present invention.

FIG. 11C is an example of a wideband circuit according to another embodiment of the present invention. Wideband circuit 1100C includes a differential stage 1101 that receives at least one differential input signal (in1_diff and in2_diff), a second differential stage 1102, and two networks 1110A-B. The first stage 1101 may be a wideband low noise amplifier (LNA), mixer, or one stage of a power amplifier, for example. Stage 1101 receives the differential input signal and generates a differential output signal at differential output terminals. Network 1110A includes an input terminal 1113A, a first network portion 1111, a second network portion 1112, a last node 1114, and a resistor 1103A. Network 1110B includes an input terminal 1113B, a first network portion 1121, a second network portion 1122, a last node 1124, and a resistor 1103B. The output terminals of stage 1101 are coupled to the input terminal 1113A of network 1110A and input terminal 1113B of network 1110B. Resistors 1103A and 1103B are coupled to the last nodes 1114 and 1124, respectively, of network 1110A and 1110B, and may set the gain of stage 1101. The first and second network portions of each network are coupled together at intermediate nodes 1115 and 1125. Stage 1102 includes differential input terminals that are coupled to the intermediate nodes of each network.

In one embodiment, differential stages may be coupled together using interstage networks described above that further include current injections circuits 1104A and 1104B. Current injection circuits 1104A-B may be used to extend bandwidth of the circuit. Such circuits may also be used reduce the required power supply voltage or reduce the power consumption of the circuit, or both. Current injection circuits 1104A-B includes a control input responsive to a signal from the opposite side of the differential circuit. The circuits output a current based on the control input. The current may be provided to any node in networks 1110A-B including the input nodes 1113A-B, any intermediate nodes (e.g., 1115 or 1125), or the last nodes (e.g., 1114 or 1124). In this example, the current injection circuits are coupled to the last nodes of each network. The control inputs of the injection circuits may be cross-coupled to nodes of the opposite differential circuit. For example, current injection circuits 1104A-B may have control inputs responsive to signals from the opposite side of the differential output stage or one of the nodes in the network. For instance, control input A may be coupled to the nodes 1113B, 1124, or 1125 of network 1110B, and control input B may be coupled to the nodes 1113A, 1114, or 1115 of network 1110A. In some embodiments, higher order networks may be used as described above. Thus, the control inputs of the current injection circuits may be cross coupled to other intermediate nodes between other network portions, for example. Current injection circuits 1104A and 1104B may provide a DC current to bias devices at the output of stage 1101. By injecting DC current into the circuit using current injection circuits, less current is required to flow through resistors 1103A and 1103B. Accordingly, lower supply voltages may be used. Additionally, when the control inputs of current injection circuits 1104A and 1104B are cross-coupled to nodes in opposite networks 1110A-B, the gain-bandwidth product ("GBW") of the resulting circuit may be increased. Accordingly, the circuit may be scaled to use smaller transistors, which result in lower current consumption.

Figure 12:
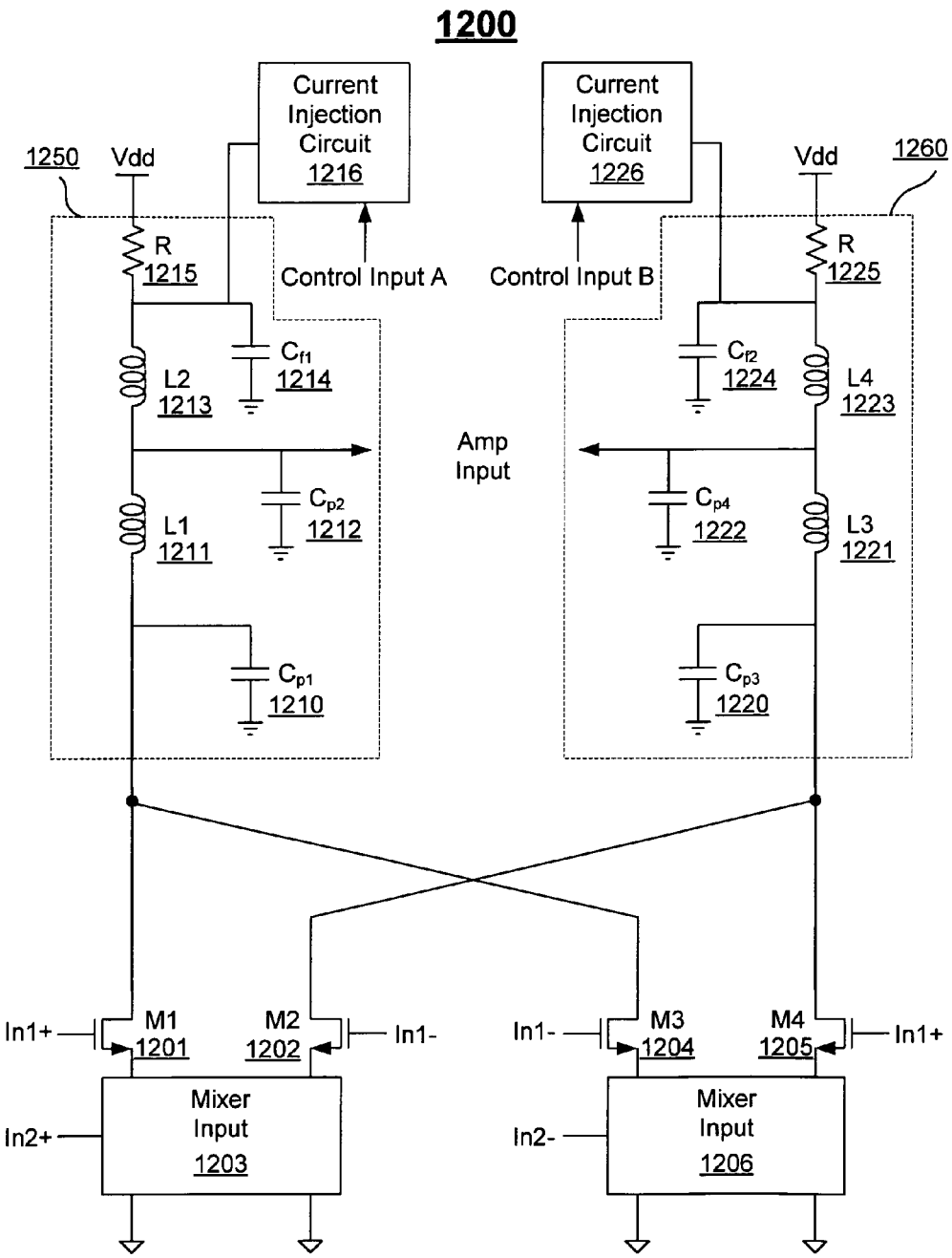
FIG. 12 is an example of a wideband mixer circuit according to one embodiment of the present invention.

FIG. 12 is an example of a wideband mixer circuit according to one embodiment of the present invention. Mixer 1200 includes cross-coupled stages comprising transistors 1201-1202 and 1204-1205. Each mixer stage includes a mixer input circuit 1203 and 1206. Mixer 1200 receives a differential input signal (in2+, in2−), which is modulated by a local oscillator signal (in1+, in1−). Each stage generates differential currents that may be added together by coupling the outputs to almost identical loads. Here, the common load is provided by two symmetric wideband LC networks of the type described above. The outputs of transistors 1201 and 1204 are coupled to a first network 1250 comprising parasitic capacitance ($C_{p1}$) 1210, inductor (L1) 1211, inductor (L2) 1213, capacitance ($C_{f1}$) 1214, resistor (R) 1215, and a parasitic capacitance ($C_{p2}$) 1212 corresponding to one input of a differential amplifier stage ("Amp Input"), for example. Similarly, the outputs of transistors 1202 and 1205 are coupled to a second network 1260 comprising parasitic capacitance ($C_{p3}$) 1220, inductor (L3) 1221, inductor (L4) 1223, capacitance ($C_{f2}$) 1224, resistor (R) 1225, and a parasitic capacitance ($C_{p4}$) 1222 corresponding to a second input of a differential amplifier stage ("Amp Input"). Parasitic capacitances 1210 and 1220 may result from the combined drain capacitances of the mixer outputs and routing capacitances, for example. From FIG. 12 it can be seen that the wideband networks 1250 and 1260 are symmetric ladder networks.

Figure 13:
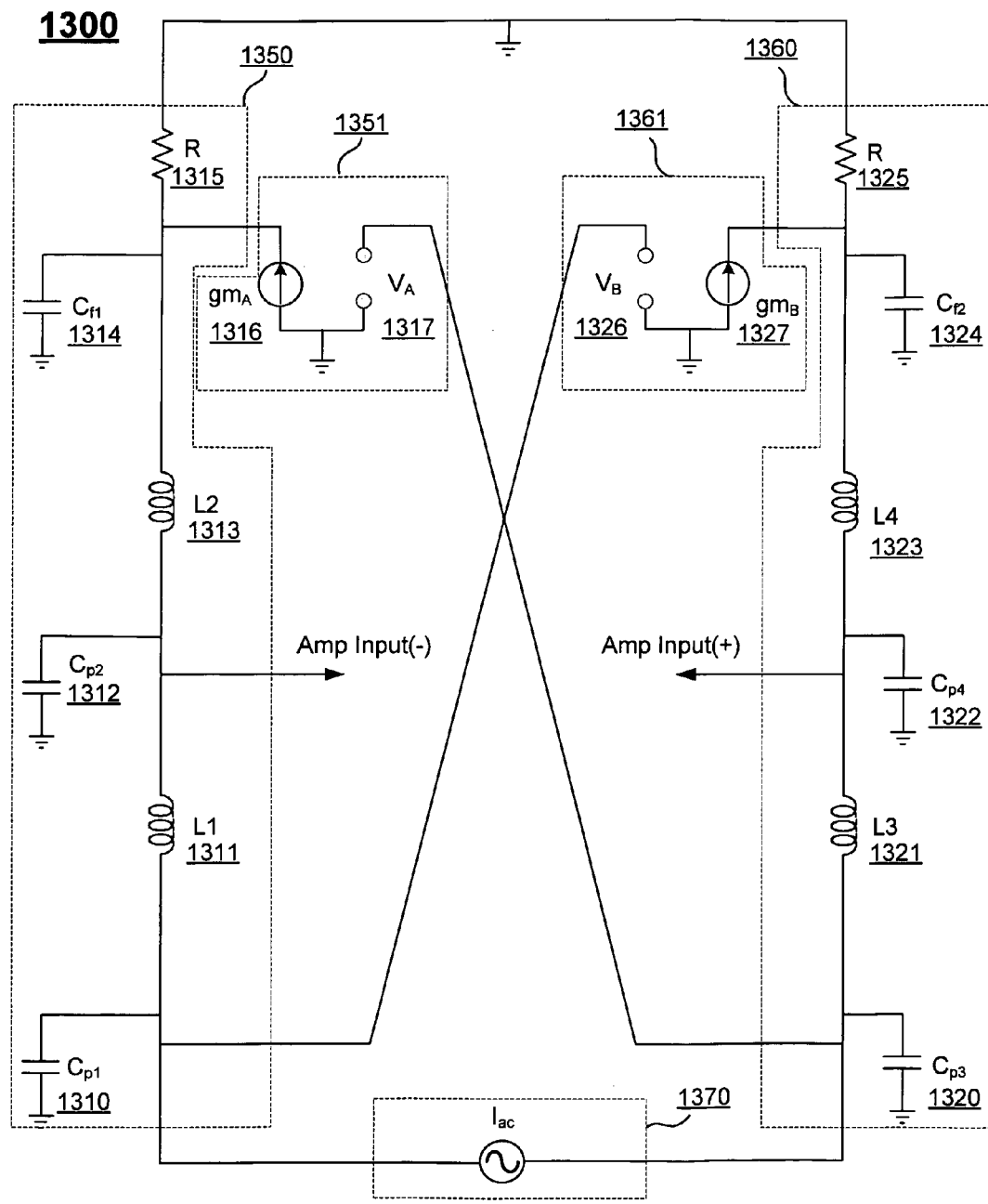
FIG. 13 is an example of a wideband circuit according to another embodiment of the present invention.

This example includes current injection circuits 1216 and 1226 to provide a regenerative load in parallel with load resistances 1215 and 1225. Typically, the load resistance dictates the amount of gain for a given circuit. In wideband circuits it is desirable to improve the performance of the gain at the frequencies in which parasitic capacitances begin to reduce the gain. Current injection circuits 1216 and 1226 increase the load impedance at high frequencies and thereby compensate for the loss in gain caused by parasitics and other passive components with a corresponding increase in gain. By introducing current into the load (or other nodes of the network) based on a signal from the opposite side of the differential circuit (e.g., the input of the network, an intermediate node of the network, or the last node of the network), the gain-bandwidth product of the circuit may be increased. The control inputs A and B to the current injection circuits 1216 and 1226, respectively, may be cross coupled to nodes on the opposing ladder networks. For example, control input A may be coupled to the node between resistor 1225 and inductor 1223 of the network 1260, and control input B may be coupled to the node between resistor 1215 and inductor 1213 in network 1250, for example. As another example, control input A may be coupled to the node between the sources of transistors 1202 and 1205 and inductor 1221 of the network 1260, and control input B may be coupled to the node between the sources of transistors 1201 and 1204 and inductor 1211 in network 1250. The control inputs may also be coupled to one or more intermediate nodes, such as the node between inductors 1211 and 1213 and the node between inductors 1221 and 1223, for example FIG. 13 is an example of a wideband circuit according to another embodiment of the present invention. FIG. 13 illustrates an AC equivalent circuit of a differential output stage in which the current injection circuits have been implemented with transconductance stages whose inputs are cross coupled to the inputs of the opposing networks. A differential circuit 1370 is coupled to two symmetric networks 1350 and 1360. The current injection circuits are represented as transconductance stages receiving control voltages Va and Vb and having a transconductances $gm_A$ and $gm_B$, respectively. In this example, input Va 1317 is coupled to the common point between L3 1321 and Cp3 1320, and input Vb 1326 is coupled to the common point between L1 1311 and Cp1 1310. The control voltage Va generates a current into the node between resistor 1315 and inductor 1313, and the control voltage Vb generates a current into the node between resistor 1325 and inductor 1323. At DC, the injected currents combine with the current in the loads 1315 and 1325 to bias the stage 1370. Because some of the current required to bias stage 1370 is provided by current injection circuits 1351 and 1361, the resistors have a lower voltage drop, which allows the circuit to operate at lower supply voltages. The injected current provided by each current injection circuit depends on the complex phase relationships at each output of stage 1370 and the frequency response of the current injection circuit itself. The effect on each output stages impedance is also related to the phase of the signal at the output of stage 1370 modified by each network. Driving each network with stage 1370 and coupling the differential signal to the opposite side of each network (or to intermediate nodes) results in increased gain-bandwidth product.

Figure 14:
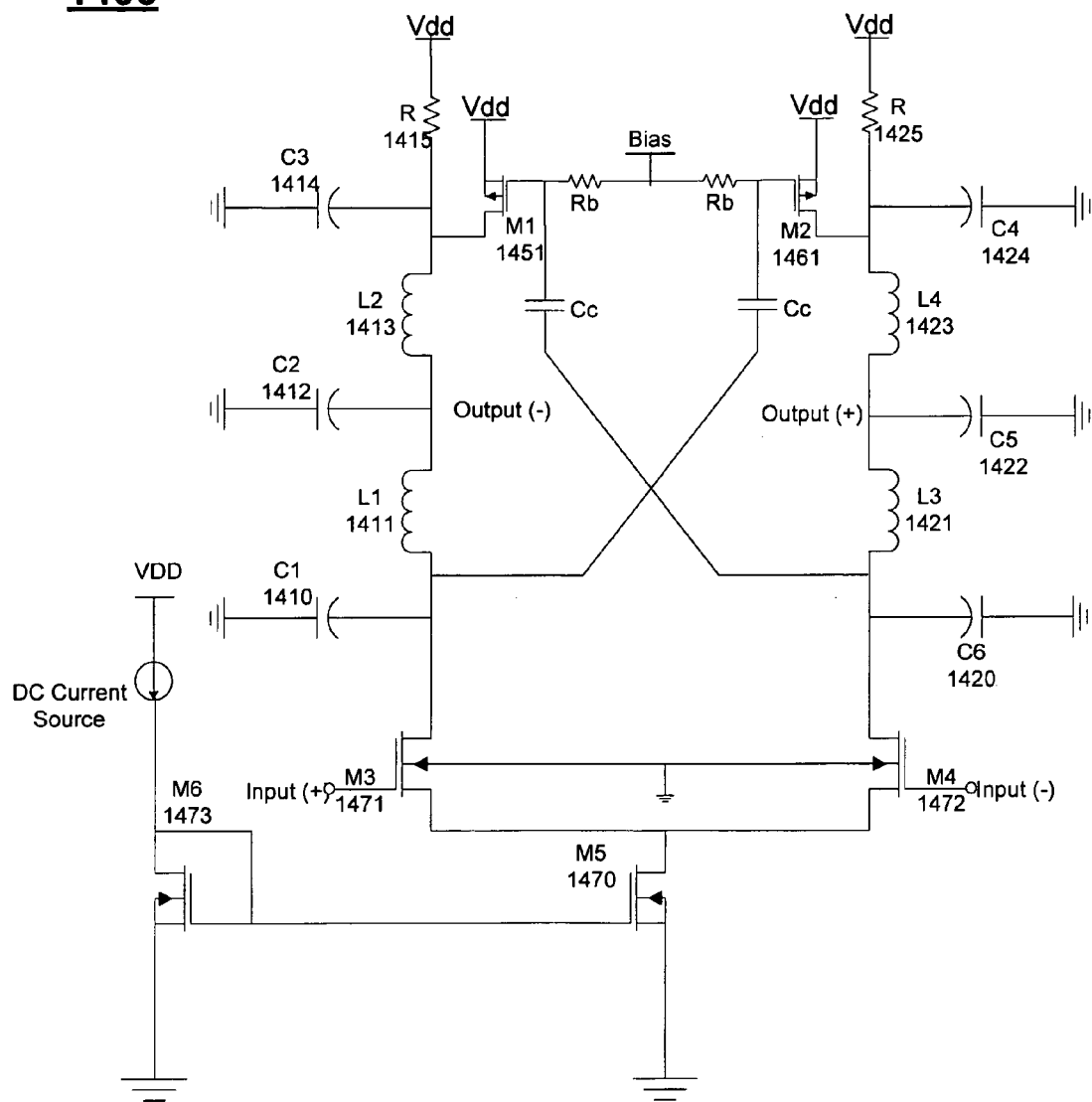
FIG. 14 is an example of a wideband circuit according to another embodiment of the present invention.

FIG. 14 is an example of a wideband circuit according to another embodiment of the present invention. In this embodiment the current injection circuits have been implemented with PMOS transistors M1 1451 and M2 1461. Each transistor is biased by coupled the gate through resistor (e.g., resistors Rb) to a supply voltage. A capacitor Cc couples the input node of the network comprising inductors L3/L4 and capacitances C4-6 to the gate of M1, and a capacitor Cc couples the input node of the network comprising inductors L1/L2 and capacitances C1-3 to the gate of M2. The following table shows the sizes of transistors M1, M2, M3, and M4, passive component values, and a bias current that may be used. Bias transistors M5 and M6 are shown for illustrative purposes to show how such a circuit may be biased.

TABLE 6

| | |
|---|---|
| C1 = C6 | 50 fF |
| L1 = L3 | 3.8 nH |
| C2 = C5 = Cload | 260 fF |
| L2 = L4 | 1.8 nH |
| C3 = C4 | 60 fF |
| R | 60 ohm |
| M1, M2 | W = 78 um, L = 130 nm |
| M3, M4 | W = 60 um, L = 130 nm |
| Bias Current in M3, M4 | 2 * 3.4 = 6.8 mA (M5) |
| Vdd | 1.1 v |
| V gate of M3, M4 | 1 v |
| V Bias (M1, M2) | 580 mv |
| Ripple | 1.4 dB (3 GHz to 9.4 GHz) |
| Gain | 11 dB |

Some single ended or differential stages may include additional current injection circuits. In one embodiment, a signal ended stage may include two current injection circuits 1104 and 1105 both having control inputs and each providing output current in response to signals received on the control inputs. The two current injection circuits may have either control inputs or outputs coupled to different nodes in the network. A variety of configurations are possible for the current injection circuits 1104 and 1105 as long as the two current injection circuits do not have both control inputs coupled to the same node and outputs coupled to the same node (i.e., in parallel, in which case they would comprise a single current injection circuit). For example, referring to FIG. 11A, if current injection circuit 1104 has a control input coupled to input node 1113 and an output coupled to last node 1114, a second current injection circuit 1105 may have a control input coupled to either last node 1114 or intermediate node 1115 and an output coupled to network input node 1113. As another example, the second current injection circuit 1105 may have an output coupled to the same node as current injection circuit 1104, but have a control input node coupled to a different node than current injection circuit 1104. Accordingly, two current injection circuits may be used having control inputs and outputs coupled to different network nodes, control inputs coupled to the same node and outputs coupled to different nodes, or outputs coupled to the same node and control inputs coupled to different nodes.

Similarly, in a differential application, additional current injection circuits may be used. For example, referring to FIG. 11B, third and fourth current injection circuits 1104C-D may have control inputs coupled to the last nodes 1114 and 1124 of networks 1110A-B and outputs coupled to network input nodes 1113A-B, respectively. As another example, the second pair of current injection circuits 1104C-D may have outputs coupled to the same node as each respective current injection circuit 1104A-B in networks 1110A-B, but have control input nodes coupled to different network nodes than current injection circuit 1104A-B. As a general example, the third current injection circuit may include a control input coupled to a node in the first or second passive network and an output coupled to the same or different node as the control input in the first or second passive network. Similarly, the fourth current injection circuit may include a control input coupled to a node in the first or second passive network and an output coupled to the same or different node as the control input in the first or second passive network. Accordingly, in one embodiment, a control input of one or more current injection circuits may be coupled to the same node as the output. A variety of configurations are possible for the current injection circuits as long as two current injection circuits do not have both control inputs coupled to the same node and outputs coupled to the same node (i.e., in parallel). Accordingly, neither the third current injection circuit nor the fourth current injection circuit have both a control input coupled to the same node as the control input of the first or second current injection circuits and an output coupled to the same node as the output of the first or second current injection circuits. Accordingly, two current injection circuit pairs for each network may be used having control inputs and outputs coupled to different network nodes, control inputs coupled to the same node and outputs coupled to different nodes, or outputs coupled to the same node and control inputs coupled to different nodes.

Figure 15:
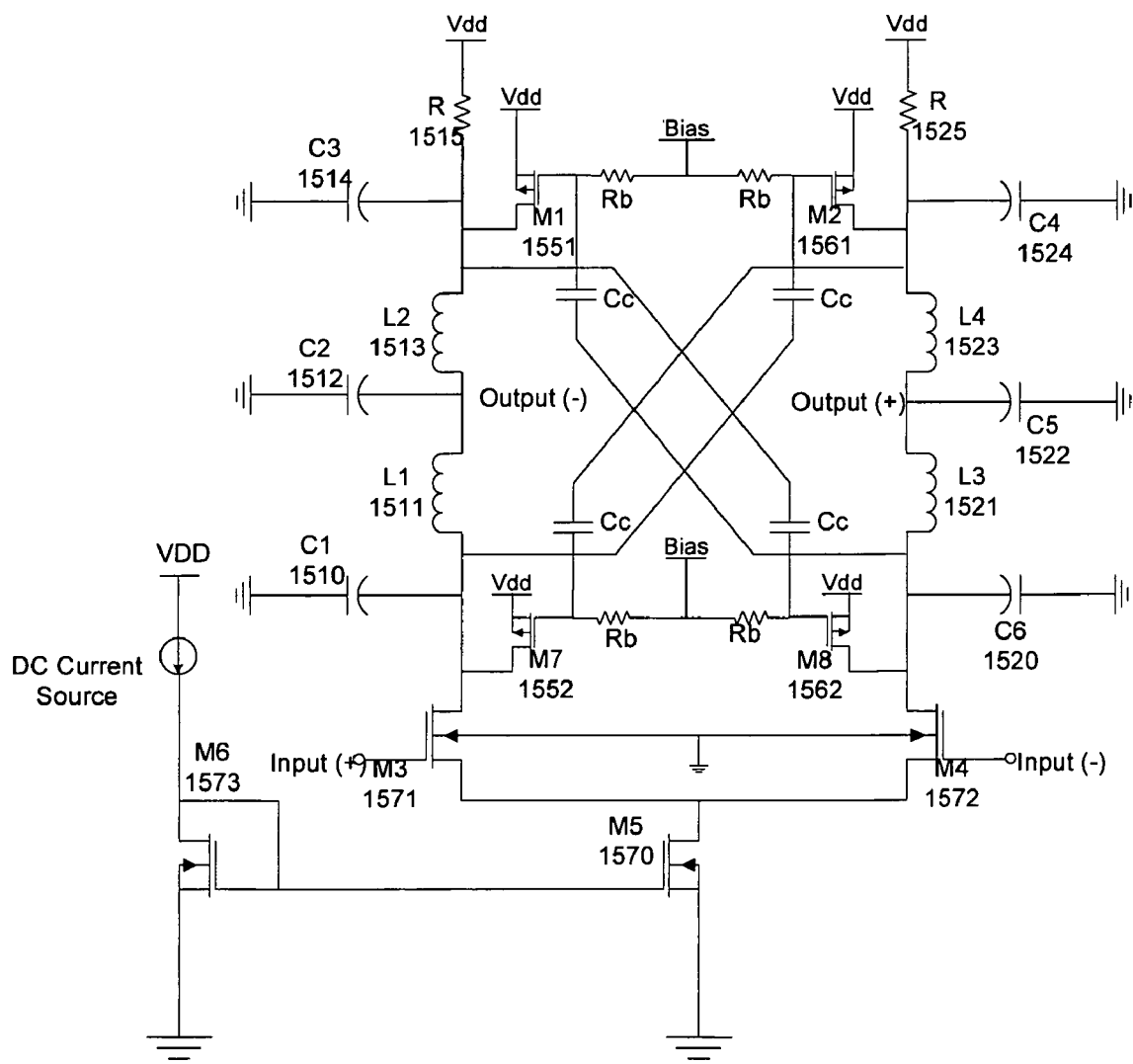
FIG. 15 is an example of a wideband circuit according to another embodiment of the present invention.

FIG. 15 is an example of a wideband circuit according to another embodiment of the present invention. In this example, a differential amplifier is coupled to two networks. The first network includes capacitors C1-C3 and inductors L1 and L2 ("the L1-2 network"). The second network includes capacitors C4-C6 and inductors L3 and L4 ("the L3-4 network"). In this embodiment, each network includes two cross coupled current injection circuits. In this example, one current injection circuit has a control input coupled to one output of a differential amplifier stage at the drain of M4 and an output coupled to the last node of the L1-2 network at resistor 1515. A second current injection circuit has a control input coupled to the last node in the L3-4 network and an output coupled to the input node of the L1-2 network. Similarly, a third current injection circuit has a control input coupled to the other output of a differential amplifier stage at the drain of M3 and an output coupled to the last node of the L3-4 network at resistor 1525. A fourth current injection circuit has a control input coupled to the last node in the L1-2 network and an output coupled to the input node of the L3-4 network. In this embodiment the current injection circuits have been implemented with PMOS transistors M1 1551, M2 1561, M7 1552, M8 1562, the corresponding resistor bias circuitry, and coupling capacitors Cc.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. In particular, while the embodiments and examples above were presented using NMOS transistors, other transistors such as PMOS or bipolar may also be used. Some or all of the transistors, inductors, capacitors, and resistors may be integrated on a single integrated circuit. Additionally, embodiments of the present invention may be used in a variety of high frequency applications such as radio frequency applications (RF) or opto-electronic systems. Example applications may include using intermediate networks with low noise amplifiers (LNA), mixer, between internal stages in amplifiers (e.g., power amplifiers), line drivers, or in high speed receivers or transmitters (e.g., fiber optic or wireless). It is also to be understood that the intermediate network may be low pass or band pass. Based on the above disclosure and the following claims, other arrangements, embodiments, implementations and equivalents will be evident to those skilled in the art and may be employed without departing from the spirit and scope of the invention as defined by the claims.

What is claimed is:

1. An electronic circuit comprising:
    a differential stage having first and second output terminals;
    a first passive network having an input terminal coupled to the first output terminal of the differential stage, the first passive network comprising a first resistive load;
    a second passive network having an input terminal coupled to the second output terminal of the differential stage, the second passive network comprising a second resistive load;
    a first current injection circuit having a control input coupled to a first node in the first passive network and an output coupled to a second node in the second passive network; and
    a second current injection circuit having a control input coupled to a third node in the second passive network and an output coupled to a fourth node in the first passive network.

2. The circuit of claim 1 wherein the first and second passive networks are symmetric.

3. The circuit of claim 1 wherein the first and second passive networks are fourth order or greater networks.

4. The circuit of claim 1 wherein the first and second passive networks are LC ladder networks.

5. The circuit of claim 1 wherein the first and second passive networks are Chebyshev filters.

6. The circuit of claim 1 wherein the first and second passive networks are Butterworth filters.

7. The circuit of claim 1 wherein the first current injection circuit comprises at least one MOS transistor and the second current injection circuit comprises at least one MOS transistor.

8. The circuit of claim 1 wherein,
    the control input of the first current injection circuit is coupled to the input of the first passive network, and
    the control input of the second current injection circuit is coupled to the input of the second passive network.

9. The circuit of claim 1 wherein,
    the control input of the first current injection circuit is coupled to an intermediate node of the first passive network, and
    the control input of the second current injection circuit is coupled to an intermediate node of the second passive network.

10. The circuit of claim 1 wherein,
    the control input of the first current injection circuit is coupled to a last node of the first passive network, and
    the control input of the second current injection circuit is coupled to a last node of the second passive network.

11. The circuit of claim 1 wherein,
    the output of the first current injection circuit is coupled to the second resistive load of the second passive network, and
    the output of the second current injection circuit is coupled to the first resistive load of the first passive network.

12. The circuit of claim 1 wherein,
    the output of the first current injection circuit is coupled to an intermediate node of the second passive network, and
    the output of the second current injection circuit is coupled to an intermediate node of the first passive network.

13. The circuit of claim 1 wherein,
    the output of the first current injection circuit is coupled to the input of the second passive network, and
    the output of the second current injection circuit is coupled to the input of the first passive network.

14. The circuit of claim 1 wherein,
    the output of the first current injection circuit is coupled to the last node of the second passive network, and
    the output of the second current injection circuit is coupled to the last node of the first passive network.

15. The circuit of claim 1 further comprising third and fourth current injection circuits, wherein the third current injection circuit includes a control input coupled to a node in the first or second passive network and an output coupled to the same or different node as the control input in the first or second passive network, wherein the fourth current injection circuit includes a control input coupled to a node in the first or second passive network and an output coupled to the same or different node as the control input in the first or second passive network, and wherein neither the third current injection circuit nor the fourth current injection circuit have both a control input coupled to the same node as the control input of the first or second current injection circuits and an output coupled to the same node as the output of the first or second current injection circuits.

16. The circuit of claim 1 further comprising third and fourth current injection circuits, wherein the control input of the first current injection circuit is coupled to a different node in the first passive network than the control input of the third current injection circuit, wherein the control input of the second current injection circuit is coupled to a different node in the second passive network than the control input of the fourth current injection circuit.

17. The circuit of claim 1 further comprising third and fourth current injection circuits, wherein the control input of the first current injection circuit is coupled to a same node in the first passive network as the control input of the third current injection circuit, and the output of the first current injection circuit is coupled to a different node than the output of the third current injection circuit, and wherein the control input of the second current injection circuit is coupled to the same node in the second passive network as the control input of the fourth current injection circuit, and the output of the second current injection circuit is coupled to a different node than the output of the fourth current injection circuit.

18. The circuit of claim 1 wherein,
the control input of the first current injection circuit is coupled to the input of the first passive network,
the output of the first current injection circuit is coupled to the second resistive load of the second passive network,
the control input of the second current injection circuit is coupled to the input of the second passive network, and
the output of the second current injection circuit is coupled to the first resistive load of the first passive network,
the circuit further comprising:
a third current injection circuit having a control input coupled to the first resistive load of the first passive network and an output coupled to the input of the second passive network, and
a fourth current injection circuit having a control input coupled to the second resistive load of the second passive network and an output coupled to the input of the first passive network.

19. The circuit of claim 18 wherein the first current injection circuit comprises a first MOS transistor, the second current injection circuit comprises a second MOS transistor, the third current injection circuit comprises a third MOS transistor, and the fourth current injection circuit comprises a fourth MOS transistor.

20. The circuit of claim 1 wherein the first stage is a power amplifier, low noise amplifier, or mixer.

21. The circuit of claim 1 further comprising a second differential stage having a first input terminal coupled to an intermediate node in the first passive network and a second input terminal coupled to an intermediate node in the second passive network.

22. The circuit of claim 21 wherein the first and second input terminals of the second differential stage have a corresponding first and second parasitic capacitances, and wherein the first parasitic capacitance is included as the capacitance of the intermediate node of the first passive network and the second parasitic capacitance is included as the capacitance of the intermediate node of the second passive network.

23. The circuit of claim 22 wherein the first parasitic capacitance is the largest capacitance in the first passive network, and wherein the second parasitic capacitance is the largest capacitance in the second passive network.

24. An electronic circuit comprising:
a first stage having a first output terminal;
a first passive network having an input terminal coupled to the first output terminal of the first stage;
a first current injection circuit having a control input coupled to a node in the first passive network and an output coupled to another node in the first passive network; and
a second stage having a first input terminal coupled to an intermediate node in the first passive network,
wherein the first input terminal of the second stage has a corresponding first parasitic capacitance, and wherein the first parasitic capacitance is included as the capacitance of the intermediate node of the first passive network.

25. The circuit of claim 24 further comprising a second current injection circuit having a control input coupled to a node in the first passive network and an output coupled to another node in the first passive network, wherein the first current injection circuit and the second current injection circuit are not coupled in parallel.

26. The circuit of claim 24 wherein the first passive network is a fourth order or greater network.

27. The circuit of claim 24 wherein the first passive network is an LC ladder network.

28. The circuit of claim 24 wherein the first passive network is a Chebyshev filter.

29. The circuit of claim 24 wherein the first passive network is a Butterworth filter.

30. The circuit of claim 24 wherein the current injection circuit comprises at least one MOS transistor.

31. The circuit of claim 24 wherein the first stage is a power amplifier, low noise amplifier, or mixer.

32. The circuit of claim 24 wherein the first parasitic capacitance is the largest capacitance in the first passive network.

33. An electronic circuit comprising:
a differential stage having first and second output terminals;
a first LC ladder network having an input terminal coupled to the first output terminal of the differential stage, the first LC ladder network comprising a first resistor;
a second LC ladder network having an input terminal coupled to the second output terminal of the differential stage, the second LC ladder network comprising a second resistor;
a first MOS transistor having a control input coupled to the input of the first LC ladder network and an output coupled to the second resistor in the second passive network; and
a second MOS transistor having a control input coupled to the input of the second LC ladder network and an output coupled to the first resistor in the first passive network.

34. The circuit of claim 33 further comprising:
a third MOS transistor having a control input coupled to the first resistor in the first passive network and an output coupled to the input of the second passive network; and
a fourth MOS transistor having a control input coupled to the second resistor in the second passive network and an output coupled to the input of the first passive network.

35. The circuit of claim 33 wherein the control input of the first MOS transistor is coupled to a bias voltage through a first resistor, and the control input of the second MOS transistor is coupled to a bias voltage through a second resistor.

36. The circuit of claim 33 wherein the control input of the first MOS transistor is coupled to the input of the first LC ladder network through a first capacitor, and the control input of the second MOS transistor is coupled to the input of the second LC ladder network through a second capacitor.

37. The circuit of claim 33 wherein the first and second LC ladder networks are Chebyshev filters.

38. The circuit of claim 33 wherein the first and second LC ladder networks are Butterworth filters.

39. The circuit of claim 33 wherein the first and second LC ladder networks are fourth order or greater networks.

40. The circuit of claim 33 further comprising a second differential stage having a first input terminal coupled to an intermediate node in the first LC ladder network and a second input terminal coupled to an intermediate node in the second LC ladder network.

41. The circuit of claim 40 wherein the first and second input terminals of the second differential stage have a corresponding first and second parasitic capacitances, and wherein the first parasitic capacitance is included as the capacitance of the intermediate node of the first LC ladder network and the second parasitic capacitance is included as the capacitance of the intermediate node of the second LC ladder network.

42. The circuit of claim 41 wherein the first parasitic capacitance is the largest capacitance in the first LC ladder network, and wherein the second parasitic capacitance is the largest capacitance in the second LC ladder network.

43. The circuit of claim 33 wherein the first stage is a power amplifier, low noise amplifier, or mixer.

44. An electronic circuit comprising:
- a differential stage having first and second output terminals;
- a first passive network having an input terminal coupled to the first output terminal of the differential stage, the first passive network comprising a first resistive load;
- a second passive network having an input terminal coupled to the second output terminal of the differential stage, the second passive network comprising a second resistive load;
- first means for injecting current to a node in the first passive network in response to a voltage from a node in the second passive network; and
- second means for injecting current to a node in the second passive network in response to a voltage from a node in the first passive network.

45. A method of processing an electronic signal comprising:
- generating first and second differential signals in a first stage at first and second output terminals;
- processing the first differential signal in a first passive network having an input terminal coupled to the first output terminal of the differential stage, the first passive network comprising a first resistive load;
- processing the second differential signal in a second passive network having an input terminal coupled to the second output terminal of the differential stage, the second passive network comprising a second resistive load;
- injecting a first current into at least one node of the first passive network based on a voltage on at least one node of the second passive network; and
- injecting a second current into at least one node of the second passive network based on a voltage on at least one node of the first passive network.

46. The method of claim 45 wherein the first current is coupled to the first resistive load based on a voltage at the input of the second passive network, and the second current is coupled to the second resistive load based on a voltage at the input of the first passive network.

47. The method of claim 46 further comprising injecting a third current into the input of the first passive network based on a voltage on the second resistive load of the second passive network, and injecting a fourth current into the input of the second passive network based on a voltage on the first resistive load of the first passive network.

48. The method of claim 45 wherein the first and second passive networks are fourth order or greater networks.

49. The method of claim 45 wherein the first and second passive networks are LC ladder networks.

50. The method of claim 45 wherein the first and second passive networks are Chebyshev filters.

51. The method of claim 45 wherein the first and second passive networks are Butterworth filters.

52. The method of claim 45 wherein the first stage is a power amplifier, low noise amplifier, or mixer.

* * * * *